US009454956B2

(12) United States Patent
Kondo

(10) Patent No.: US 9,454,956 B2
(45) Date of Patent: *Sep. 27, 2016

(54) SOUND PROCESSING DEVICE

(71) Applicant: Yamaha Corporation, Hamamatsu-shi, Shizuoka-ken (JP)

(72) Inventor: Kazunobu Kondo, Hamamatsu (JP)

(73) Assignee: Yamaha Corporation, Hamamatsu-shi (JP)

(*) Notice: Subject to any disclaimer, the term of this patent is extended or adjusted under 35 U.S.C. 154(b) by 701 days.

This patent is subject to a terminal disclaimer.

(21) Appl. No.: 13/681,290

(22) Filed: Nov. 19, 2012

(65) Prior Publication Data

US 2013/0129099 A1 May 23, 2013

(30) Foreign Application Priority Data

Nov. 22, 2011 (JP) ................................ 2011-255402
Sep. 11, 2012 (JP) ................................ 2012-199269

(51) Int. Cl.

| | |
|---|---|
| ***H03G 3/00*** | (2006.01) |
| ***H04R 29/00*** | (2006.01) |
| ***G10K 15/08*** | (2006.01) |
| ***G10K 15/12*** | (2006.01) |

(52) U.S. Cl.

CPC ............... *G10K 15/08* (2013.01); *G10K 15/12* (2013.01)

(58) Field of Classification Search

CPC .... G10K 15/12; G10K 15/08; G10K 11/002; H04M 9/082; H04B 3/23
USPC ....... 381/58, 63, 66, 71.1, 71.11, 94.1, 94.2, 381/94.3
See application file for complete search history.

(56) References Cited

U.S. PATENT DOCUMENTS 6,163,608 A * 12/2000 Romesburg ........... H04M 9/082 379/406.01
2009/0129520 A1* 5/2009 Yamamoto ............. H04B 1/123 375/343
2010/0123907 A1* 5/2010 Edgar ................ G06K 9/00483 358/1.5
2013/0243211 A1* 9/2013 Kondo ..................... H04R 3/04 381/63

FOREIGN PATENT DOCUMENTS

JP 6-249949 A 9/1994
JP 3-579639 B2 7/2004
JP 2009-212599 A 9/2009

OTHER PUBLICATIONS

Furuya, K. et al. (Jul. 2007). "Robust Speech Dereverberation Using Multichannel Blind Deconvolution With Spectral Substraction," IEEE Transactions on Audio, Speech, and Language Processing 15(5):1579-1591.

* cited by examiner

*Primary Examiner* — Vivian Chin
*Assistant Examiner* — William A Jerez Lora
(74) *Attorney, Agent, or Firm* — Morrison & Foerster LLP

(57) ABSTRACT

In a sound processing device, an index value calculation unit calculates a first index value that follows change of a sound signal at a first following degree and a second index value that follows the change of the sound signal at a second following degree which is lower than the first following degree. An adjustment value calculation unit calculates an adjustment value effective to adjust a reverberation component of the sound signal based on difference between the first index value and the second index value. A reverberation adjustment unit applies the adjustment value to the sound signal.

19 Claims, 10 Drawing Sheets

SOUND PROCESSING DEVICE

BACKGROUND OF THE INVENTION

1. Technical Field of the Invention

The present invention relates to a technology of processing a sound signal, and more particularly to a technology of suppressing or enhancing a reverberation component contained in a sound signal.

2. Description of the Related Art

A technology of suppressing a reverberation component contained in a sound signal has been proposed. For example, patent literature 1 discloses a technology of estimating a predictive filter coefficient of a reverberation component contained in a sound signal using a probability model of the predictive filter coefficient to estimate the reverberation component and suppressing the reverberation component using a predictive filter after estimation. Also, non-patent literature 1 discloses a technology of estimating an inverse filter of a transfer function from a sound generation source to a sound receiving point and applying the inverse filter after estimation to a sound signal to suppress a reverberation component.

[Patent Literature 1] Japanese Patent Application Publication No. 2009-212599

[Non-Patent Literature 1] K. Furuya, et al. "Robust speech dereverberation using multichannel blind deconvolution with spectral subtraction", IEEE Transactions on Audio, Speech, and Language Processing, vol. 15, no. 5, p. 1579-1591, 2007

SUMMARY OF THE INVENTION

In order to estimate the predictive filter coefficient of patent literature 1 or the inverse filter of non-patent literature 1 at high precision, however, enormous operations are necessary. The present invention, has been made in view of the above problem, and it is an object, of the present invention to adjust (suppress or enhance) a reverberation component of a sound signal through a simple process.

In order to solve the above problem, a sound processing device according to the present invention comprises: an index value calculation unit configured to calculate a first index value that follows change of the sound signal at a first following degree and a second index value that follows the change of the sound signal at a second following degree which is lower than, the first following degree; an adjustment value calculation unit configured to calculate an adjustment value effective to adjust a reverberation component of the sound signal based on difference between the first index value and the second index value; and a reverberation adjustment unit configured to apply the adjustment value to the sound signal. In the above construction, an adjustment value of a noise component is calculated based on the difference between the first index value and the second index value following the time change of the sound signal, and therefore, it is possible to adjust the noise component of the sound signal through a simple process as compared with the technology of patent literature 1 and the technology of non-patent literature 1.

Specifically, it is possible to suppress the reverberation component of the sound signal according to a construction in which the adjustment value calculation unit is configured to calculate a first adjustment value in case that the first index value exceeds the second index value (for example, in a section SA) and configured to calculate a second adjustment value in case that the first index value is lower than the second index value (for example, in a section SB), and the reverberation adjustment unit is configured to apply the second adjustment value to the sound signal so that the sound signal is suppressed more than a case in which the reverberation adjustment unit applies the first adjustment value to the sound signal.

For example, the adjustment value calculation unit comprises: a ratio calculation unit configured to calculate a ratio of the first index value to the second index value; and a threshold value processing unit configured to set the adjustment value to a predetermined value (for example, a predetermined value Gmax) in case that the ratio exceeds the predetermined value, and configured to set the adjustment value to the ratio in case that the ratio is below the predetermined value.

On the other hand, it is possible to enhance (extract) the reverberation component of the sound signal according to a construction in which the adjustment value calculation unit is configured to calculate a first adjustment value in case that the first index, value exceeds the second index value (for example, in the section SA) and configured to calculate a second adjustment value in case that the first index value is lower than the second index value (for example, in the section SB), and the reverberation adjustment unit is configured to apply the first adjustment value to the sound signal so as to suppress the sound signal more than a case in which the reverberation adjustment unit applies the second adjustment value to the sound signal.

In a preferred embodiment of the invention, the sound processing device further comprises: a band dividing unit configured to divide in a time domain the sound signal into a plurality of band components corresponding to a plurality of frequency bands; a frequency analysis unit configured to successively calculate a spectrum of the sound signal; and an adjustment processing unit configured to calculate a plurality of adjustment values corresponding to the plurality of the frequency bands from the adjustment value calculated by the adjustment calculation unit, wherein the index value calculation unit is configured to calculate the first index value and the second index value corresponding to time series of magnitudes of the sound signal at each frequency of the spectrum of the sound signal. According to this embodiment, it is possible to advantageously suppress delay of the reverberation component before and after the adjustment. Meanwhile, the concrete example of the embodiment will be described below, for example, as a sixth embodiment in the specification.

In a first aspect of the present invention, the index value calculation unit comprises: a first smoothing unit configured to smooth a time series of an intensity of the sound signal by a first time constant (for example, a time constant $\tau 1$) so as to calculate the first index value; and a second smoothing unit configured to smooth the time series of the intensity of the sound signal by a second time constant (for example, a time constant $\tau 2$) exceeding the first time constant so as to calculate the second index value. In the above aspect, the time constant of smoothing performed by the first smoothing unit and the time constant of smoothing performed by the second smoothing unit are set so that the time constant of smoothing performed, by the first smoothing unit and the time, constant of smoothing performed by the second smoothing unit are different from each other, and therefore, it is possible to simply calculate the first index value and the second index value. Meanwhile, the signal intensity of the sound signal means the amplitude of the sound signal or the power of the amplitude (for example, the square or the fourth power of the amplitude).

In a concrete example of the first aspect, the first smoothing unit is configured to calculate a moving average (for example, a simple moving average or a weighted moving average) of the intensity of the sound signal within a first period moving along the time series of the intensity of the sound signal for obtaining the first index value, and the second smoothing unit is configured to calculate a moving average of the intensity of the sound signal within a second period which is set longer than the first period and which moves along the time series of the intensity of the sound signal for obtaining the second index value.

Also, it is also preferable for the first smoothing unit to calculate an exponential average of the intensity of the sound signal with a first smoothing coefficient (for example, a smoothing coefficient $\alpha 1$) for obtaining the first index value, and for the second smoothing unit to calculate an exponential average of the intensity of the sound signal with a second smoothing coefficient (for example, a smoothing coefficient $\alpha_2$) which is set below the first smoothing coefficient for obtaining the second index value. Meanwhile, the concrete example of the first aspect will be described below, for example, as a first embodiment.

In a second aspect of the present invention, the index value calculation unit is configured to generate the first index value by smoothing a time series of an intensity of the sound signal in a first manner and configured to generate the second index value by smoothing the time series of the intensity of the sound signal in a second manner different than the first manner so that a time change of the second index value delays from a time change of the first index value. In the above aspect, it is possible to calculate the first index value and the second index value through a simple construction of delaying the second index value with respect to the first index value. Meanwhile, a concrete example of the second aspect will be described below, for example, as a second embodiment.

In a third aspect of the present invention, the sound processing device is configured to process the sound signal that is a stereo signal composed of a first signal (for example, a sound signal $x_L(t)$) and a second signal (for example, a sound signal $x_R(t)$), wherein the index value calculation unit comprises: a cross correlation calculation unit configured to sequentially calculate a spatial cross correlation between the first signal and the second signal; an auto correlation calculation unit configured to sequentially calculate a spatial auto correlation of either the first signal or the second signal; a first smoothing unit configured to smooth a time series of the spatial cross correlation so as to calculate the first index value; and a second smoothing unit configured to smooth a time series of the spatial auto correlation so as to calculate the second index value. In the above aspect, the spatial cross correlation between the first signal and the second signal is smoothed to calculate the first index value, and the spatial auto correlation of the first signal and/or the second signal is smoothed to calculate the second index value, and therefore, it is possible to effectively adjust the reverberation component as compared with, for example, a construction of calculating the first index value and the second index value through smoothing of common signal intensity. Meanwhile, a concrete example of the third aspect will be described below, for example, as a third embodiment.

In a preferred aspect of the present invention, the index value calculation unit is configured to calculate a plurality of first index values and a plurality of second index values corresponding to a plurality of frequencies of components contained in the sound signal, the adjustment value calculation unit is configured to calculate a plurality of adjustment values from the plurality of the first index values and the plurality of the second index values in correspondence to the plurality of the frequencies of the components contained in the sound signal, and the reverberation adjustment unit is configured to apply each adjustment value to each component of the corresponding frequency contained in the sound signal. According to this aspect of the invention, the adjustment value is calculated every frequency (every band) and applied to each frequency component of the sound signal. Consequently, it is possible to individually adjust the reverberation component at every frequency of the sound signal.

For example, it is preferable to provide a construction in which the index value calculation unit is configured to calculate each first index value with a first time constant for smoothing of the sound signal, the first time constant being set individually for each frequency of the sound signal, and configured to calculate each second index value with a second time constant for smoothing of the sound signal, the second time constant being set individually for each frequency of the sound signal. For example, when considering a tendency that the reverberation component is tangible in a low range, in the construction including the first smoothing unit and the second smoothing unit, the time constants are individually set at every frequency so that the higher the frequency is, the closer the time constant of smoothing performed by the first smoothing unit and the time constant of smoothing performed by the second smoothing unit become to each other. According to the above construction, the adjustment value is rapidly changed in the low range in which the reverberation component is tangible, and therefore, it is possible to effectively adjust the reverberation component.

In a preferred aspect of the present invention, the index value calculation unit is configured to calculate each first index value with a first time constant for smoothing of the sound signal, the first time constant being set variably along a time passage of the sound signal, and configured to calculate each second index value with a second time constant for smoothing of the sound signal, the second time constant being set variably along a time passage of the sound signal. According to the above aspect, it is possible to change a degree of adjustment of the reverberation component over time. For example, the greater the difference between the time constant to calculate the first index value and the time constant to calculate the second index value is, the more rapidly the adjustment value is changed. According to a construction of increasing the time constant to calculate the first index value with respect to the time constant to calculate the second index value over time, therefore, it is possible to rapidly adjust the reverberation component.

In a preferred aspect of the present invention, the adjustment value calculation unit is configured to successively calculate a plurality of adjustment values in correspondence to a time series of unit intervals of the sound signal, and the reverberation adjustment unit is configured to apply the adjustment value of one unit interval to the sound signal of another unit interval which is positioned prior to said one unit interval. According to the above aspect, the adjustment value of one unit interval is applied to the past sound signal, and therefore, it is possible to effectively adjust the reverberation component even in a case in which the reverberation component is gently changed. Meanwhile, a concrete example of the above aspect will be described below, for example, as a fifth embodiment.

In a preferred embodiment of the invention, the reverberation adjustment unit is configured to apply the adjustment value to the sound signal so that the sound signal contains therein a post reverberation period, wherein the adjustment value calculation unit is configured to sequentially calculate a time series of adjustment values in correspondence to a time series of unit intervals of the sound signal, so that the adjustment value calculation unit calculates the adjustment value effective to adjust the reverberation component with a first suppression effect in case that the corresponding unit interval belongs to a period other than the post reverberation period, and calculates the adjustment value effective to adjust the reverberation component with a second suppression effect exceeding the first suppression effect in case that the corresponding unit interval belongs to the post reverberation period. According to this embodiment, since variation of volume is suppressed in the post reverberation period, it is possible to advantageously prevent quality degradation of reproduced sound after the adjustment of the reverberation. Meanwhile, a concrete example of the above embodiment will be described below, for example, as a seventh embodiment.

There are various methods for determining whether each unit interval belongs to the post reverberation period. For example, the adjustment value calculation unit is configured to determine whether each unit interval belongs to the post reverberation period or not by comparing the first index value corresponding to each unit interval with a predetermined threshold value. Otherwise, the index value calculation unit is configured to calculate a third index value that follows the change of the sound signal at a third following degree that is set between the first index value and the second index value, and the adjustment value calculation unit is configured to determine whether each unit interval belongs to the post reverberation period or not according to the third index value.

The sound processing device according to each aspect as described above is realized by hardware (an electronic circuit), such as a digital signal processor (DSP) which is exclusively used to process a sound signal, and, in addition, is realized by a combination of a general operation processing device, such as a central processing unit (CPU), and a program. A program according to the present invention enables a computer to execute processing of: calculating a first index value that follows change of the sound signal at a first following degree and a second index value that follows the change of the sound signal at a second following degree which is lower than the first following degree; calculating an adjustment value effective to adjust a reverberation component of the sound signal based on difference between the first index value and the second index value; and applying the adjustment value to the sound signal. The program as described above realizes the same operation and effects as the sound processing device according to the present invention. Meanwhile, the program according to the present invention is provided in a form in which the program is stored in machine readable non-transitory recording media that can be read by a computer so that the program can be installed in the computer, and, in addition, is provided in a form in which the program is distributed via a communication network so that the program can be installed in the computer.

DETAILED DESCRIPTION OF THE INVENTION

First Embodiments

Figure 1:
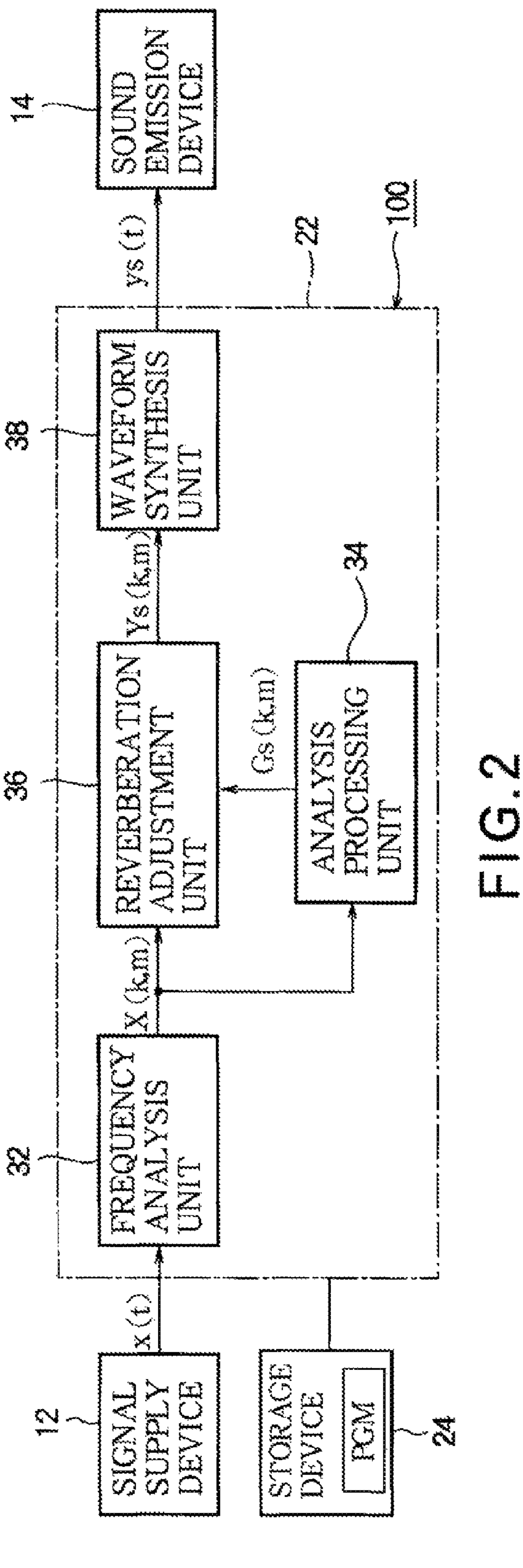
FIG. 1 is a block diagram of a sound processing device according to a first embodiment of the present invention.

FIG. 1 is a block diagram of a sound processing device 100 according to a first embodiment of the present invention. As shown in FIG. 1, a signal supply device 12 and a sound emission device 14 are connected to the sound processing device 100. The signal supply device 12 supplies a sound signal x(t) (t: time) to the sound processing device 100. The sound signal x(t) is a signal of a time domain representing the waveform of a sound obtained by adding a reverberation (an initial reflected sound and a rear reverberation sound) arriving at a sound receiving point after reflection in an acoustic space to a direct sound directly arriving at the sound receiving point from a sound generation source. For example, a sound signal x(t) of a sound obtained by applying a reverberation effect to an existing sound, such as a recorded sound or a synthesized sound, or a sound signal x(t) of a sound, actually recorded in an acoustic space (for example, an acoustic hall, etc.) having a reverberation effect may be properly used. The signal supply device 12 may include various devices such as a sound receiving instrument that receives a surrounding sound to generate a sound signal x(t), a reproduction device that acquires a sound signal x(t) from a portable or built-in recording medium and supplies the acquired sound signal to the sound processing device 100, or a communication device that receives a sound signal x(t) from a communication network and supplies the received sound signal to the sound processing device 100.

The sound processing device 100 according to the first embodiment of the present invention is a reverberation suppression device that generates a sound signal (a sound signal in which a direct sound or an initial reflected sound has been enhanced) ys(t) in which a reverberation component (especially, a rear reverberation sound) of the sound signal x(t) has been suppressed. The sound emission device 14 (for example, a speaker or a headphone) reproduces a sound wave corresponding to the sound signal ys(t) generated by the sound processing device 100. Meanwhile, a digital to analog (D/A) converter to convert the sound signal ys(t) from digital to analog is not shown for the sake of simplicity.

As shown in FIG. 1, the sound processing device 100 is realized by a computer system including an operation processing device 22 and a storage device 24. The storage device 24 stores a program $P_{GM}$ executed by the operation processing device 22 and various kinds of data used by the operation processing device 22. A combination of well-known recording media, such as a semiconductor storage medium and a magnetic storage medium, and a plurality of kinds of machine readable non-transitory recording media may be optionally adopted as the storage device 24. A construction of storing the sound signal x(t) in the storage device 24 (therefore, the signal, supply device 12 is omitted) is also preferred.

The operation processing device 22 executes the program $P_{GM}$ stored in the storage device 24 to realize a plurality of functions (a frequency analysis unit 32, an analysis processing unit 34, a reverberation adjustment unit 36, and a waveform synthesis unit 38) to generate the output sound signal ys(t) from the input sound signal x(t). Meanwhile, a construction of dispersing the respective functions of the operation processing device 22 to a plurality of integrated circuits or a construction in which an exclusive electronic circuit (DSP) realizes the respective functions may be adopted.

The frequency analysis unit 32 sequentially generates a spectrum (complex spectrum) X(k, m) of the sound signal x(t) in every unit interval (frame) on a time axis. Symbol k indicates a variable to designate an arbitrary frequency (band) on a frequency axis, and symbol m indicates a variable to designate an arbitrary unit interval on a time axis (a specific time point on the time axis). Well-known frequency analysis, such as short time Fourier transform, may be optionally adopted to generate the spectrum X(k, m). Meanwhile, a filter bank constituted by a plurality of band pass filters having different pass bands may be adopted as the frequency analysis unit 32.

The analysis processing unit 34 calculates an adjustment value Gs(k, m) of the sound signal x(t) corresponding to the spectrum X(k, m) at every frequency in each unit interval. The adjustment value Gs(k, m) of the first embodiment is a variable to suppress a reverberation component (especially, a rear reverberation sound) of the sound signal x(t). Roughly speaking, there is a tendency that the more predominant a reverberation component (rear reverberation sound) is in a k-th frequency component of the sound signal x(t) of an m-th unit interval, the smaller the adjustment value Gs(k, m) becomes.

The reverberation adjustment unit 36 applies the adjustment value Gs(k, m) calculated by the analysis processing unit 34 to the sound signal x(t). The adjustment of the reverberation adjustment unit 36 is sequentially performed with respect to each frequency in every unit interval. Specifically, the reverberation adjustment unit 36 multiplies the spectrum X(k, m) of the sound signal x(t) by an adjustment value Gs(k, m) calculated with respect to a unit interval and frequency common to the corresponding spectrum X(k, m) to calculate a spectrum Ys(k, m) of the sound signal ys(t) (Ys(k, m)=Gs(k, m)X(k, m)). That is, the adjustment value Gs(k, m) is equivalent to a gain with respect to the spectrum X(k, m) of the sound signal x(t).

The waveform synthesis unit 38 generates a sound signal ys(t) of a time domain from the spectrum Ys(k, m) generated by the reverberation adjustment unit 36 in every unit interval. That is, the waveform synthesis unit 38 converts the spectrum Ys(k m) in each unit interval to a signal of a time domain through short time inverse Fourier transform and interconnects unit intervals arranged in tandem to generate the sound signal ys(t). The sound signal ys(t) generated by the waveform synthesis unit 38 is supplied to the sound emission device 14, and is reproduced by the sound emission device 14 as a sound wave.

Figure 2:
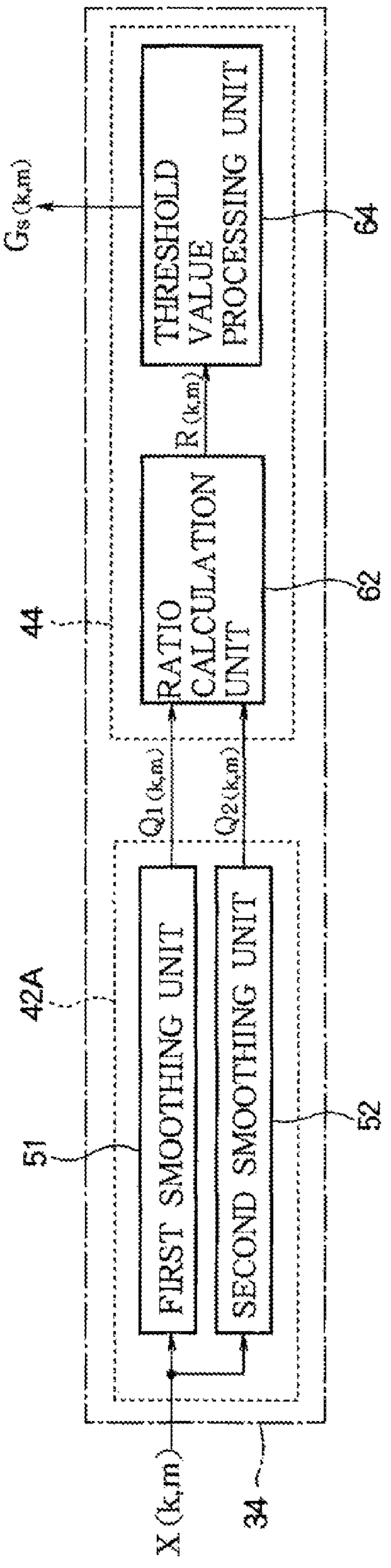
FIG. 2 is a block diagram of an analysis processing unit in the first embodiment.

FIG. 2 is a block diagram of the analysis processing unit 34 of the first embodiment of the present invention. As shown in FIG. 2, the analysis processing unit 34 of the first embodiment of the present invention includes an index value calculation unit 42A and an adjustment value calculation unit 44. The index value calculation unit 42A sequentially calculates a first index value $Q_1(k, m)$ and a second index value $Q_2(k, m)$ corresponding to the sound signal x(t). Specifically, the index value calculation unit 42A includes a first smoothing unit 51 and a second smoothing unit 52. The first smoothing unit 51 smoothes a time, series of power $|X(k, m)|^2$ of the sound signal x(t) to sequentially calculate a first index value $Q_1(k, m)$ of each frequency in every unit interval. In the same manner, the second smoothing unit 52 smoothes a time series of power $|X(k, m)|^2$ of the sound signal x(t) to sequentially calculate a second index value $Q_2(k, m)$ of each frequency in every unit interval.

As defined by the following equation (1A), the first index value $Q_1(k, m)$ is a moving average (simple moving average) of power $|X(k, m)|^2$ in a first period constituted by $N_1$ ($N_1$ being a natural number equal to or greater than 1) unit intervals arranged in tandem. The first period is a set of $N_1$ unit intervals having, for example, an m-th unit interval as the last one. As defined by the following equation (1B), on the other hand, the second index value $Q_2(k, m)$ is a moving average (simple moving average) of power $|X(k, m)|^2$ in a second period constituted by $N_2$ ($N_2$ being a natural number equal to or greater than 2) unit intervals arranged in tandem. The second period is a set of $N_2$ unit intervals having, for example, an m-th unit interval as the last one. As can be understood from the above description, the first smoothing unit 51 and the second smoothing unit 52 are equivalent to a finite impulse response (FIR) type low pass filter. It is possible to set the number $N_1$, of the unit intervals to 1. In such a case, the power $|X(k, m)|^2$ of the sound signal x(t) can be directly utilized as the first index value $Q_1(k, m)$.

$$Q_1(k, m) = \frac{1}{N_1} \sum_{i=0}^{N_1-1} |X(k, m-i)|^2 \tag{1A}$$

$$Q_2(k, m) = \frac{1}{N_2} \sum_{i=0}^{N_2-1} |X(k, m-i)|^2 \tag{1B}$$

The number $N_2$ of the unit intervals used for to calculation of the second index value $Q_2(k, m)$ exceeds the number $N_1$ of the unit intervals used for calculation of the first index value $Q_1(k, m)$ ($N_2>N_1$). That is, the second period is longer than the first period. For example, the first period is set to a time span from about 100 milliseconds to about 300 milliseconds, and the second period is set to a time span from about 300 milliseconds to about 600 milliseconds. Consequently, a time constant τ2 of smoothing performed by the second smoothing unit 52 exceeds a time constant τ1 of smoothing performed by the first smoothing unit 51 (τ2>τ1). In a case in which the first smoothing unit 51 and the second smoothing unit 52 are realized by a low pass filter, a cutoff frequency of the second smoothing unit 52 may be below a cutoff frequency of the first smoothing unit 51.

Figure 3:
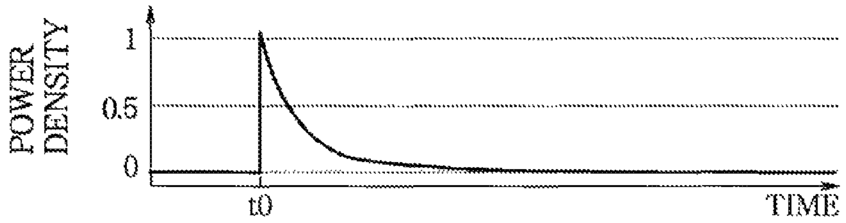
FIGS. 3(A)-3(C) are a view illustrating a relationship among a first index value, a second index value, and an adjustment value.
Figure 3:
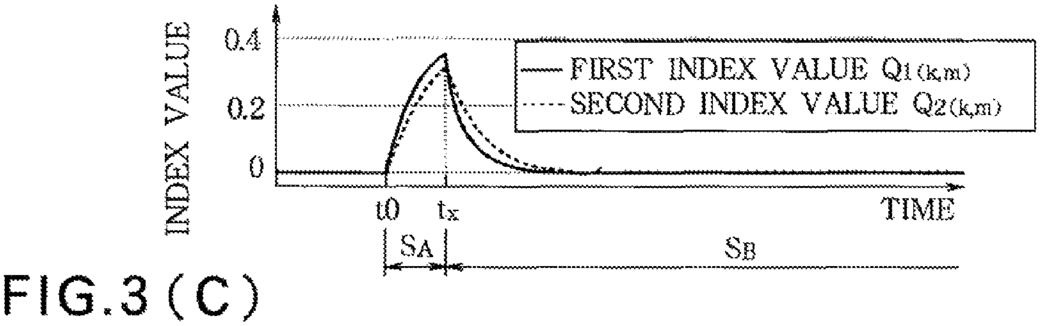
Figure 3:
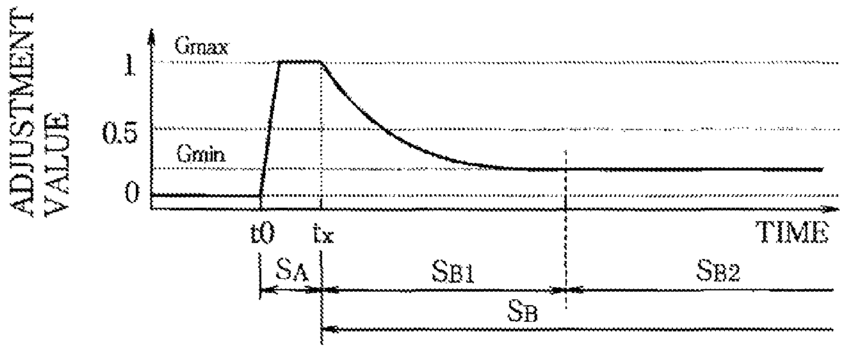

FIG. 3(B) is a graph showing time change of the first index value $Q_1$(k, m) and the second index value $Q_2$(k, m) calculated at an arbitrary frequency of the sound signal x(t). The first index value $Q_1$(k, m) and the second index value $Q_2$(k, m) are calculated in a situation in which a room impulse response (RIR), power $|X(k, m)|^2$ (power density) of which is exponentially attenuated as shown in FIG. 3(*a*), is supplied to the sound processing device 100 as the sound signal x(t).

As can be understood from FIG. 3(B), the first index value $Q_1$(k, m) and the second index value $Q_2$(k, m) are changed over time, following the power $|X(k, m)|^2$ (power density) of the sound signal x(t). Since the time constant τ2 of smoothing performed by the second smoothing unit 52 exceeds the time constant τ1 of smoothing performed by the first smoothing unit 51, the second index value $Q_2$(k, m) follows the time change of the power $|X(k, m)|^2$ (power density) of the sound signal x(t) at a lower following degree (at a lower rate of change) than the first index value $Q_1$(k, m). Specifically, as shown in FIG. 3(B), the first index value $Q_1$(k, m) increases at a rate of change exceeding the second index value $Q_2$(k, m) in a section immediately after a time point t0 when the room impulse response is commenced. Then, the first index value $Q_1$(k, m) and the second index value $Q_2$(k, m) reach peaks at different time points on a time axis, and the first index value $Q_1$(k, m) decreases at a rate of change exceeding the second index value $Q_2$(k, m).

Since the first index value $Q_1$(k, m) and the second index value $Q_2$(k, m) time-vary at different rates of change as described above, the levels of the first index value $Q_1$(k, m) and the second index value $Q_2$(k, m) are reversed at a specific time point tx on the time axis. That is, the first index value $Q_1$(k, m) exceeds the second index value $Q_2$(k, m) in a section SA from the time point t0 to the time point tx, and the second index value $Q_2$(k, m) exceeds the first index value $Q_1$(k, m) in a section SB after the time point tx. The section SA is equivalent to a period in which a direct sound and an initial reflected sound of the room impulse response are present, and the section SB is equivalent to a period in which a rear reverberation sound of the room impulse response is present.

The adjustment value, calculation unit 44 of FIG. 2 sequentially calculates an adjustment value Gs(k, m) corresponding to the first index value $Q_1$(k, m) and the second index value $Q_2$(k, m) calculated by the index value calculation unit 42A with respect to each frequency in every unit interval. The adjustment value calculation unit 44 of the first embodiment of the present invention includes a ratio calculation unit 62 and a threshold value processing unit 64.

The ratio calculation unit 62 calculates a ratio R(k, m) of the first index value $Q_1$(k, m) to the second index value $Q_2$(k, m). Specifically, as represented by the following equation (2), the ratio calculation unit 62 calculates a ratio R(k, m) of the first index value $Q_1$(k, m) to the second index value $Q_2$(k, m) in every unit interval, $$R(k, m) = \frac{Q_1(k, m)}{Q_2(k, m)} \tag{2}$$

The threshold value processing unit 64 of FIG. 2 calculates an adjustment value Gs(k, m) corresponding to the result of comparison between the ratio R(k, m) calculated by the ratio calculation unit 62 and a predetermined value Gmax and between the ratio R(k, m) and another predetermined value Gmin in every unit interval. The predetermined value Gmax and the predetermined value Gmin are threshold values preset, for example, according to a user command so as to be compared with the ratio R(k, m). In the first embodiment, a case in which the predetermined value Gmax is set to 1 is illustrated. The predetermined value Gmin is set to a value (a value not less than 0 and less than 1) below the predetermined value Gmax.

Specifically, the threshold value processing unit 64 operates the following equation (3). First, in a case in which the ratio R(k, m) exceeds the predetermined value Gmax (Gmax=1) (R(k, m)≥Gmax (Gmax=1)), the threshold value processing unit 64 sets the predetermined value Gmax as the adjustment value Gs(k, m). Second, in a case in which the ratio R(k, m) is below the predetermined value Gmin (R(k, m)≤Gmin), the threshold value processing unit 64 sets the predetermined value Gmin as the adjustment value Gs(k, m). Third, in a case in which the ratio R(k, m) is a value between the predetermined value Gmax and the predetermined value Gmin (Gmin<R(k, m)<Gmax), the threshold value processing unit 64 sets the ratio R(k, m) as the adjustment value Gs(k, m).

$$Gs(k, m) = \begin{cases} G_{max} & (R(k, m) \geq G_{max}) \\ R(k, m) & (G_{min} < R(k, m) < G_{max}) \\ G_{min} & (R(k, m) \leq G_{min}) \end{cases} \tag{3}$$

The change of the adjustment value Gs(k, m) in a case in which the first index value $Q_1$(k, m) and the second index value $Q_2$(k, m) are changed as shown in FIG. 3(B) is shown in FIG. 3(C). As can be understood from FIG. 3(C), roughly speaking, a first adjustment value Gs(k, m) in a case in which the first index value $Q_1$(k, m) exceeds the second index value $Q_2$(k, m) (section SA) is greater than a second adjustment value Gs(k, m) in a case in which the first index value $Q_1$(k, m) is below the second index value $Q_2$(k, m) (section SB). Specifically, since the ratio R exceeds the predetermined value Gmax (Gmax=1) in the section SA in which the first index value $Q_1$(k, m) exceeds the second index value $Q_2$(k, m), the adjustment value Gs(k, m) is maintained at the predetermined value Gmax. Also, in a section SB1 in which the ratio R exceeds the predetermined value Gmin, of the section SB in which the first index value $Q_1$(k, m) is below the second index value $Q_2$(k, m), the adjustment value Gs(k, m) is set to ratio R(k, m) and decreases over time. Also, in a section SB2 in which the ratio R is below the predetermined value Gmin, of the section SB, the adjustment value Gs(k, m) is maintained at the predetermined value Gmin.

That is, the adjustment value Gs(k, m) of the first embodiment is set to the predetermined value (maximum value) Gmax in the section SA in which a direct sound and an initial reflected sound are present, and decreases over time to the predetermined value (minimum value) Gmin in the section SB in which a rear reverberation sound is present. Consequently, the reverberation adjustment unit 36 applies the adjustment value Gs(k, m) to the input sound signal x(t) to generate an output sound signal ys(t) in which a reverberation component of the sound signal x(t) has been suppressed (in which a direct sound or an initial reflected sound has been enhanced).

In the first embodiment as described above, the adjustment value Gs(k, m) is calculated based on the ratio R(k, m) of the first index value $Q_1$(k, m) to the second index value $Q_2$(k, m) following the time change of the sound signal x(t), and therefore, it is possible to suppress the reverberation component of the sound signal x(t) through a simple process, as compared with a technology of patent literature 1 for estimating a predictive filter coefficient of a reverberation component and a technology of non-patent literature 1 for estimating a transfer function to generate an inverse filter. Meanwhile, the reverberation component may lower precision of sound source separation and feature extraction (for example, pitch detection) of the sound signal x(t). If sound source separation and feature extraction are performed with respect to the sound signal ys(t) after suppression of the reverberation component in the first embodiment, it is possible to realize high-precision sound source separation and feature extraction. Also, since howling may be acoustically regarded as a reverberation component, it is also possible to suppress increase of howling over time through suppression of the reverberation component in the first embodiment.

Meanwhile, there has been proposed acoustic echo cancellation or acoustic echo suppression to cancel acoustic echo in voice communication, such as telephony, as a technology compared with reverberation suppression. Actually, however, the acoustic echo cancellation or the acoustic echo suppression is fundamentally different from the reverberation suppression. For example, in the acoustic echo cancellation, acoustic characteristics (room impulse response) in a sound receiving environment is estimated, for example, using an adaptive algorithm, and a filter based on the estimation result is applied to a sound signal at a transmission side to subtract acoustic echo from the sound signal after sound reception, thereby cancelling the acoustic echo. Also, in the acoustic echo suppression, acoustic echo that has not been cancelled out through the above-mentioned acoustic echo cancellation performed as a pre-process is suppressed using a method, such as spectral subtraction. On the other hand, in the reverberation suppression of the first embodiment, the reverberation component is suppressed without estimating acoustic characteristics in a sound receiving environment. Also, in the acoustic echo cancellation or the acoustic echo suppression, acoustic echo caused by the delay of a sound directly arriving at a sound receiving point from a sound generation source is also processed in addition to acoustic echo caused by the delay of a reflected sound arriving at the sound receiving point after reflection in an acoustic space. That is, the acoustic echo cancellation or the acoustic echo suppression is performed with respect to the entirety of the sound arriving at the sound receiving point from the sound generation source. On the other hand, reverberation suppression is performed with respect to the sound (especially, rear reverberation sound) arriving at the sound receiving point after reflection in the acoustic space, but is not performed with respect to the direct sound directly arriving at the sound receiving point from the sound generation source. As is apparent from the above description, the reverberation suppression of the first embodiment is fundamentally different from the well-known acoustic echo cancellation or acoustic echo suppression.

Modification of the First Embodiment (1) Although, in the above description, the simple moving average of the power $|X(k, m)|^2$ of the sound signal x(t) is calculated as the first index value $Q_1$(k, m) and the second index value $Q_2$(k, m), the method of calculating the first index value $Q_1$(k, m) and the second index value $Q_2$(k, m) is not limited to the above illustration. For example, as represented by the following equations (4A) and (4B), it is also possible to calculate an exponential average (exponential moving average) of the power $|X(k, m)|^2$ of the sound signal x(t) as the first index value $Q_1$(k, m) and the second index value $Q_2$(k, m).

$$Q_1(k,m)=\alpha_1\cdot|X(k,m)|^2+(1-\alpha_1)\cdot Q_1(k,m-1) \tag{4A}$$

$$Q_2(k,m)=\alpha_2\cdot|X(k,m)|^2+(1-\alpha_2)\cdot Q_2(k,m-1) \tag{4B}$$

That is, the first smoothing unit 51 and the second smoothing unit 52 are equivalent to an infinite impulse response (IIR) type low pass filter. Symbol $\alpha_1$ of equation (4A) and symbol $\alpha_2$ of equation (4B) are smoothing coefficients (forgetfulness coefficients). Specifically, the smoothing coefficient $\alpha_1$ means weight of current power $|X(k, m)|^2$ with respect to the past first index value $Q_1$(k, m), and the smoothing coefficient $\alpha_2$ means weight of current power $|X(k, m)|^2$ with respect to the past second index value $Q_2$(k, m). The smoothing coefficient $\alpha_2$ is set to a value below the smoothing coefficient $\alpha_1$ ($\alpha_2<\alpha_1$). In the same manner as the first embodiment, therefore, a time constant τ2 of smoothing performed by the second smoothing unit 52 exceeds a time constant τ1 of smoothing performed by the first smoothing unit 51 (τ2>τ1). That is, the second index value $Q_2$(k, m) follows the power $|X(k, m)|^2$ of the sound signal x(t) at a lower following degree than the first index value $Q_1$(k, m). It is possible to set the smoothing coefficient $\alpha_1$ to 1. In such a case the power $|X(k, m)|^2$ of the sound signal x(t) is directly utilized as the first index value $Q_1$(k, m).

(2) As represented by the following equations (5A) and (5B), it is also possible to calculate a weighted moving average of the power $|X(k, m)|^2$ of the sound signal x(t) as the first index value $Q_1$(k, m) and the second index value $Q_2$(k, m), Symbol $w_1$(i) of equation (5A) and symbol $w_2$(i) of equation (5B) mean weighted values to an i-th unit interval positioned before an m-th unit interval. A condition that a second period is longer than a first period ($N_2>N_1$) is the same as the above illustration.

$$Q_1(k,m)=\frac{1}{N_1}\sum_{i=0}^{N_1-1} w_1(i)|X(k,m-i)|^2 \tag{5A}$$

$$Q_2(k,m)=\frac{1}{N_2}\sum_{i=0}^{N_2-1} w_2(i)|X(k,m-i)|^2 \tag{5B}$$

Second Embodiment

Hereinafter, a second embodiment of the present invention will be described. Meanwhile, elements of each embodiment illustrated below that are identical in operation and function to those of the first embodiment will be denoted by reference numerals referred to in describing the first embodiment, and a detailed description thereof will be properly omitted.

Figure 4:
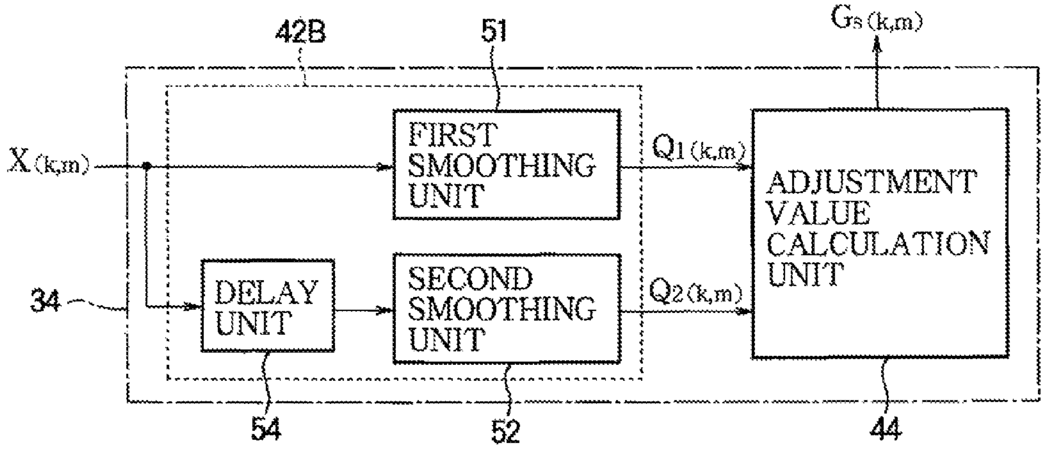
FIG. 4 is a block diagram of an analysis processing unit in a second embodiment of the present invention.

FIG. 4 is a block diagram of an analysis processing unit 34 in a second embodiment of the present invention. The analysis processing unit 34 of the second embodiment includes an index value calculation unit 42B in place of the index value calculation unit 42A of the analysis processing unit 34 of the first embodiment. The index value calculation unit 42B is an element to sequentially calculate a first index value $Q_1(k, m)$ and a second index value $Q_2(k, m)$ in every unit interval. The index value calculation unit 42B includes a first smoothing unit 51 and a second smoothing unit 52. Meanwhile, an adjustment value calculation unit 44 is identical in construction and operation to that of the first embodiment.

In the same manner as the first embodiment, the first smoothing unit 51 smoothes a time series of power $|X(k, m)|^2$ of a sound signal x(t) to sequentially calculate a first index value $Q_1(k, m)$ in every unit interval, A delay unit 54 is a memory circuit to delay a spectrum X(k, m) of the sound signal x(t) as much as time equivalent to d (d being a natural number) unit intervals. The second smoothing unit 52 smoothes a time series of power $|X(k, m)|^2$ of the spectrum X(k, m) delayed by the delay unit 54 to sequentially calculate a second index value $Q_2(k, m)$ in every unit interval. In the second embodiment, however, a time constant τ2 of smoothing performed by the second smoothing unit 52 is equal to a time constant τ1 of smoothing performed by the first smoothing unit 51 (τ2=τ1). Consequently, time change of the second index value $Q_2(k, m)$ corresponds to time change of the first index value $Q_1(k, m)$ delayed as much as d unit intervals ($Q_2(k, m)=Q_1(k, m-d)$).

Figure 5A:
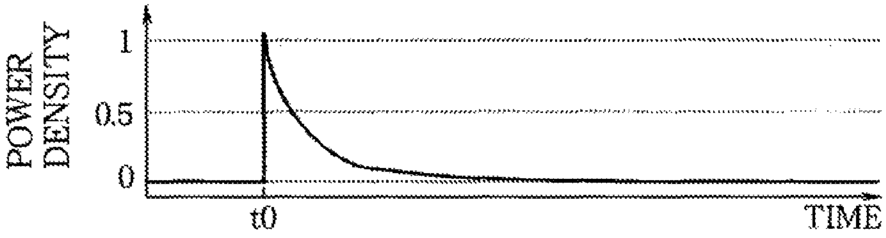
FIGS. 5(A)-5(C) are a view illustrating a relationship among a first index value, a second index value, and an adjustment value in the second embodiment of the present invention.
Figure 5B:
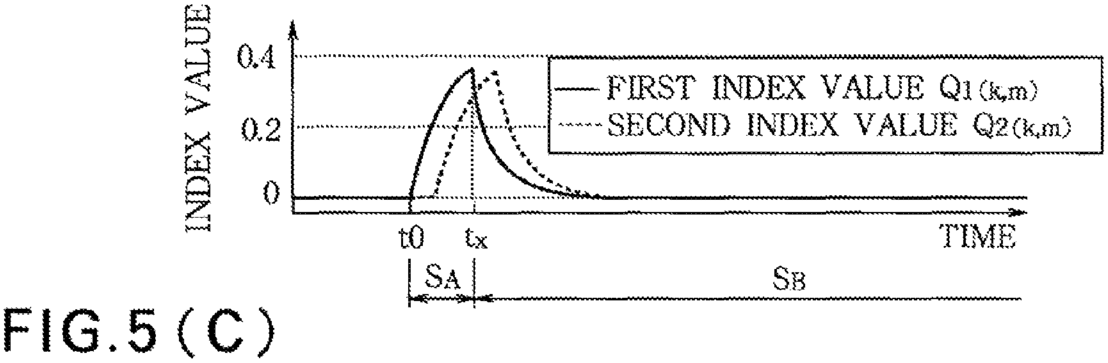

FIG. 5(B) is a graph showing time change of the first index value $Q_1(k, m)$ and the second index value $Q_2(k, m)$ in a case in which the same room impulse response (FIG. 5(A)) as FIG. 3(A) is supplied to a sound processing device 100 according to a second embodiment of the present invention as the sound signal x(t).

As can be understood from FIG. 5(B), time change modes (waveforms) of the first index value $Q_1(k, m)$ and the second index value $Q_2(k, m)$ are common, but the time change of the second index value $Q_2(k, m)$ is delayed as much as d unit intervals with respect to the time change of the first index value $Q_1(k, m)$. That is, the second index value $Q_2(k, m)$ follows the power $|X(k, m)|^2$ of the sound signal x(t) at a lower following degree than the first index value $Q_1(k, m)$. In the same manner as the first embodiment, therefore, the levels of the first index value $Q_1(k, m)$ and the second index value. $Q_2(k, m)$ are reversed at a specific time point tx on a time axis. That is the first index value $Q_1(k, m)$ exceeds the second index value $Q_2(k, m)$ in a section SA before the time point tx, and the second index value $Q_2(k, m)$ exceeds the first index value $Q_1(k, m)$ in a section SB after the time point tx.

Figure 5C:
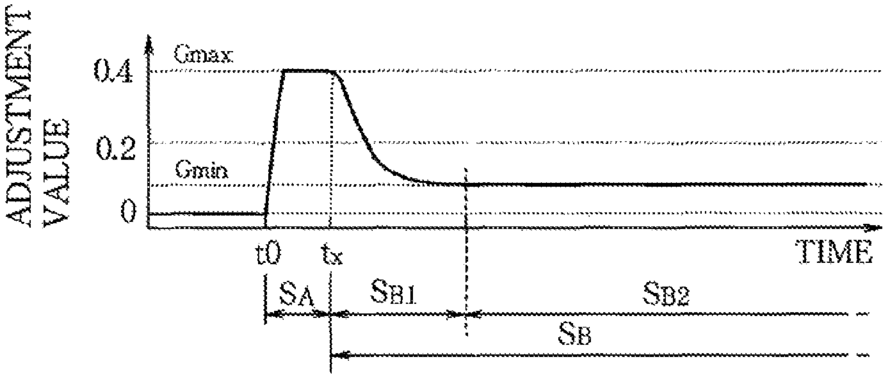

Calculation (equation (2)) of a ratio R(k, m) performed by a ratio calculation unit 62 and calculation (equation (3)) of an adjustment value Gs(k, m) performed by a threshold value processing unit 64 are the same as the first embodiment. As shown in FIG. 5(C), therefore, the adjustment value Gs(k, m) is set to a predetermined value Gmax in the section SA in which a direct sound and an initial reflected sound are present, and decreases over time to a predetermined value Gmin in the section SB in which a rear reverberation sound is present. A reverberation adjustment unit 36 applies the adjustment value Gs(k, m) as described above to the sound signal x(t) to generate a sound signal ys(t) in which a reverberation component has been suppressed.

The second embodiment also realizes the same effects as the first embodiment. Meanwhile, as can be understood from comparison between FIG. 5(C) and FIG. 3(C), the adjustment value Gs(k, m) of the second embodiment more steeply decreases in the section SB (SB1) than the adjustment value Gs(k, m) of the first embodiment. According to the second embodiment, therefore, it is possible to much more strengthen a suppression effect of the reverberation component than in the first embodiment. In the first embodiment, on the other hand, the delay unit 54 of FIG. 4 is not necessary, and therefore, it is possible to simplify the construction of the sound processing device 100.

Modification of the Second Embodiment (1) Although, in the second embodiment, the spectrum X(k, m) of the sound signal x(t) is delayed by the delay unit 54, it is possible to adopt a construction in which the delay unit 54 is disposed at the rear stage of the second smoothing unit 52 so that the second index value $Q_2(k, m)$ calculated by the second smoothing unit 52 is delayed by the delay unit 54.

Figure 6:
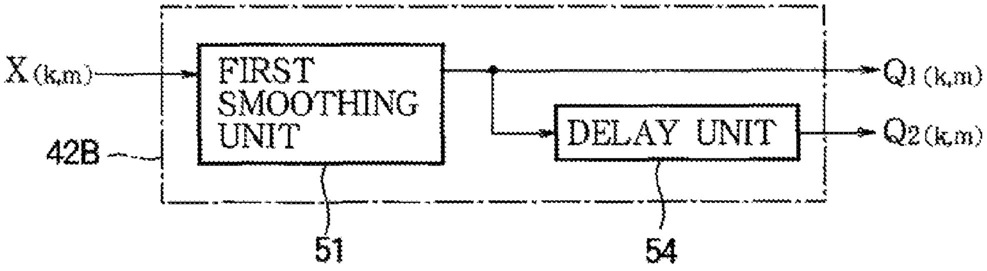
FIG. 6 is a block diagram of an index value calculation unit according to a modification of the second embodiment of the present invention.

(2) As shown in FIG. 6, it is also possible to omit the second smoothing unit 52 of FIG. 4. An index value calculation unit 42B of FIG. 6 includes a first smoothing unit 51 and a delay unit 54. The delay unit 54 delays a first index value $Q_1(k, m)$ calculated by the first smoothing unit 51 as much as d unit intervals to calculate a second index value $Q_2(k, m)$ ($Q_2(k, m)=Q_1(k, m-d)$).

(3) Manners of operations performed by the first smoothing unit 51 and the second smoothing unit 52 are properly changed. For example, it is also possible to calculate the first index value $Q_1(k, m)$ and the second index value $Q_2(k, m)$ through the operation of the exponential average of equation (4A) and equation (4B) or the weighted moving average of equation (5A) and equation (5B).

(4) A time constant τ1 of smoothing performed by the first smoothing unit 51 may be different from a time constant τ2 of smoothing performed by the second smoothing unit 52. For example, in a case in which the time constant τ2 exceeds the time constant τ1 in the same manner as the first embodiment, it is possible to reduce time delayed by the delay unit 54 as compared with a case in which the time constant τ1 is equal to the time constant τ2.

Third Embodiment

Figure 7:
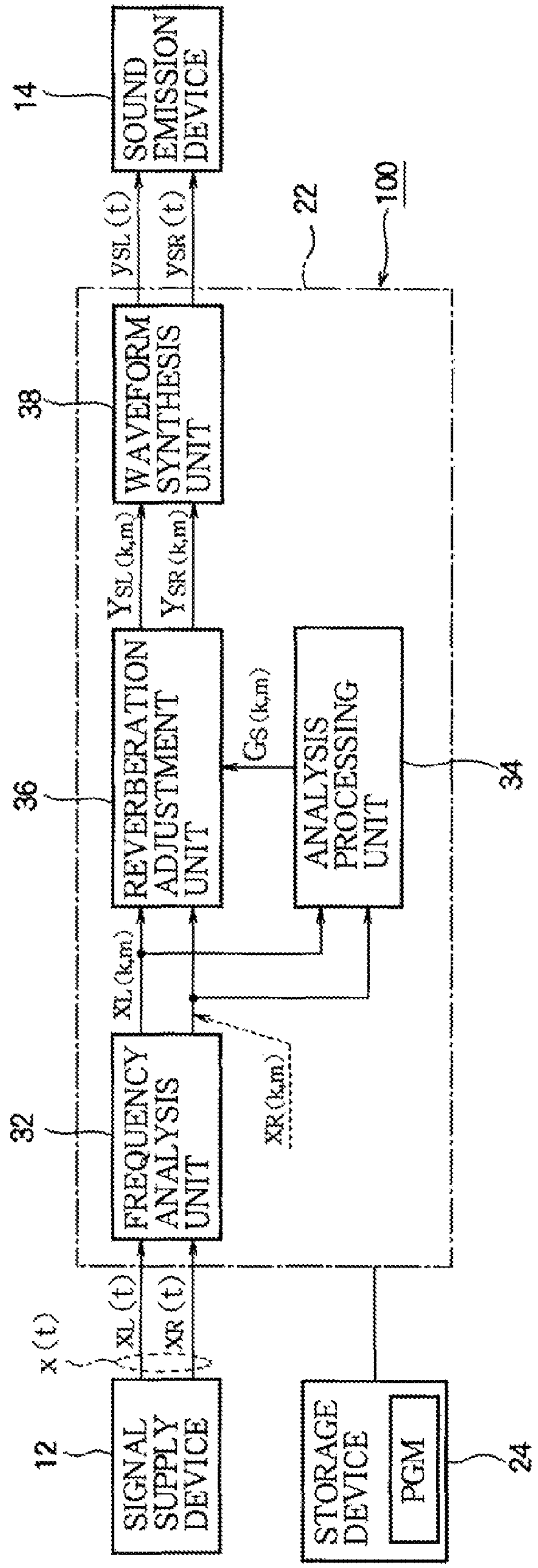
FIG. 7 is a block diagram of a sound processing device according to a third embodiment of the present invention.

FIG. 7 is a block diagram of a sound processing device 100 according to a third embodiment of the present invention. As shown in FIG. 7, an input sound signal x(t) of the third embodiment is a stereo signal including a left channel sound signal $x_L(t)$ and a right channel sound signal $x_R(t)$. The sound processing device 100 generates an output left channel sound signal ysL(t) in which a reverberation component of the sound signal $x_L(t)$ has been suppressed and a right channel sound signal ysR(t) in which a reverberation component of the sound signal $x_R(t)$ has been suppressed.

A frequency analysis unit 32 of FIG. 7 generates a spectrum $X_L(k, m)$ of the sound signal $x_L(t)$ and a spectrum $X_R(k, m)$ of the sound signal $X_R(t)$ in every unit interval. An analysis processing unit 34 of FIG. 7 calculates an adjustment value Gs(k, m) corresponding to the spectrum $X_L(k, m)$ and the spectrum $X_R(k, m)$ in every unit interval. A reverberation adjustment unit 36 applies the adjustment value Gs(k, m) to the sound signal $x_L(t)$ and the sound signal $x_R(t)$. Specifically, the reverberation adjustment unit 36 multiplies the spectrum $X_L(k, m)$ of the sound signal $x_L(t)$ by the adjustment value Gs(k, m) to calculate a spectrum YsL(k, m) of the sound signal ysL(t) ($YsL(k, m)=Gs(k, m)\, X_L(k, m)$). Also, the reverberation adjustment unit 36 multiplies the spectrum $X_R(k, m)$ of the sound signal $x_R(t)$ by the adjustment value Gs(k, m) to calculate a spectrum YsR(k, m) of the sound signal ysR(t) ($YsR(k, m)=Gs(k, m)X_R(k, m)$). A waveform synthesis unit 38 generates a sound signal ysL(t)

from the spectrum YsL(k, m) of each unit interval. Also, the waveform synthesis unit 38 generates a sound signal ysR(t) from the spectrum YsR(k, m) of each unit interval.

Figure 8:
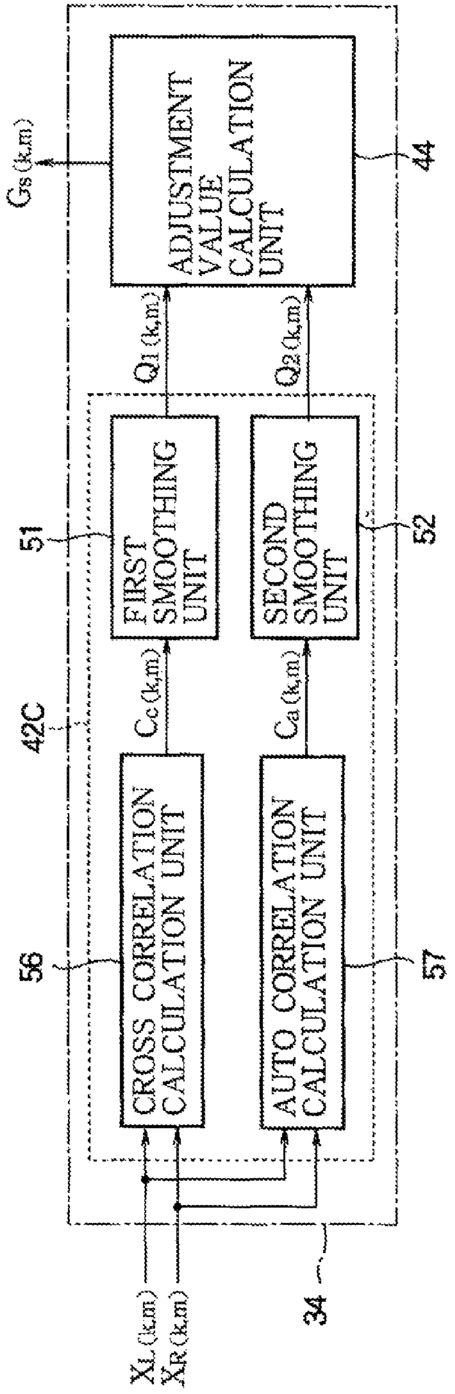
FIG. 8 is a block diagram of an analysis processing unit in the third embodiment of the present invention.

FIG. 8 is a block diagram of the analysis processing unit 34 in the third embodiment of the present invention. The analysis processing unit 34 of the third embodiment includes an index value calculation unit 42C in place of the index value calculation unit 42A of the analysis processing unit 34 of the first embodiment. An adjustment value calculation unit 44 is identical in construction and operation to that of the first embodiment.

As shown in FIG. 8, the index value calculation unit 42C of the third embodiment includes a cross correlation calculation unit 56, an auto correlation calculation unit 57, a first smoothing unit 51, and a second smoothing unit 52. The cross correlation calculation unit 56 calculates a spatial cross correlation Cc(k, m) between the spectrum $X_L(k, m)$ of the sound signal $x_L(t)$ and the spectrum $X_R(k, m)$ of the sound signal $x_R(t)$ (between the left and right channels) with respect to each frequency in every unit interval. On the other hand, the auto correlation calculation unit 57 calculates an added value Ca(k, m) of a spatial auto correlation of the spectrum $X_L(k, m)$ of the sound signal $x_L(t)$ and the spectrum $X_R(k, m)$ of the sound signal $x_R(t)$. Specifically, the spatial cross correlation Cc(k, m) is represented by the following equation (6A), and the spatial auto correlation (sum between channels) Ca(k, m) is represented by the following equation (6B). Symbol * of equation (6A) indicates a complex conjugate. As can be understood from equation (6B), the spatial auto correlation Ca(k, m) is a total sum of powers $|X_L(k, m)|^2$ and $|X_R(k, m)|^2$ of the left and right channels.

$$C_c(k,m)=X_L(k,m)X_R^*(k,m) \quad (6A)$$

$$C_a(k,m)=|X_L(k,m)|^2+|X_R(k,m)|^2 \quad (6B)$$

The first smoothing unit 51 of FIG. 8 smoothes a time series of the spatial cross correlation Cc(k, m) calculated by the cross correlation calculation unit 56 to sequentially calculate a first index value $Q_1(k, m)$ of each frequency in every unit interval. In the same manner, the second smoothing unit 52 smoothes a time series of the spatial auto correlation Ca(k, m) calculated by the auto correlation calculation unit 57 to sequentially calculate a second index value $Q_2(k, m)$ of each frequency in every unit interval. In the same manner as the first embodiment, a time constant $\tau 2$ of smoothing performed by the second smoothing unit 52 exceeds a time constant $\tau 1$ of smoothing performed by the first smoothing unit 51 ($\tau 2>\tau 1$). The adjustment value calculation unit 44 is identical in construction and operation to that of the first embodiment. The adjustment value calculation unit 44 calculates an adjustment value Gs(k, m) corresponding to the first index value $Q_1(k, m)$ and the second index value $Q_2(k, m)$.

Figure 9:
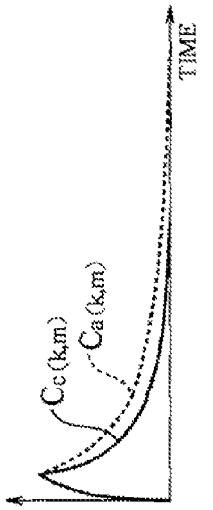
FIG. 9 is a graph showing a relationship between spatial cross correlation and spatial auto correlation.

FIG. 9 is a typical view showing time change of the spatial cross correlation Cc(k, m) and the spatial auto correlation Ca(k, m) in a case in which a room impulse response is supplied as the sound signal x(t) ($x_L(t)$, $x_R(t)$). A direct sound or an initial reflected sound arrive on a sound receiving point with clear directionality, but a rear reverberation sound arriving at the sound receiving point in various directions has unclear directionality. Consequently, the correlation (spatial correlation) between the left channel sound signal $x_L(t)$ and the right channel sound signal $x_R(t)$ may be lowered as much as the rear portion of the reverberation component due to the lowering of directionality as described above. That is, the spatial cross correlation Cc(k, m) is lowered over time due to both the attenuation of power of the sound signal x(t) and the lowering of directionality. On the other hand, the lowering of the spatial auto correlation Ca(k, m) over time is caused only by the attenuation of power of the sound signal x(t). As can be understood from FIG. 9, the spatial cross correlation Cc(k, m) is more steeply lowered than the spatial auto correlation Ca(k, m) due to the difference as described above.

In the third embodiment, therefore, the first index value $Q_1(k\ m)$ is more steeply lowered than the second index value $Q_2(k, m)$ in, the section SB having the rear reverberation sound, as compared with the first embodiment in which the first index value $Q_1(k, m)$ and the second index value $Q_2(k, m)$ are calculated by smoothing the common power $|X(k, m)|^2$. That is, in the first embodiment, the first index value $Q_1(k, m)$ and the second index value $Q_2(k, m)$ are changed in the same manner in a case in which the time constant $\tau 1$ and the time constant $\tau 2$ are common. In the third embodiment, on the other hand, the first index value $Q_1(k, m)$ is more steeply changed than the second index value $Q_2(k, m)$ even in a case in which the time constant $\tau 1$ and the time constant $\tau 2$ are common. As can foe understood from the above description, according to the third embodiment, the adjustment value Gs(k, m) steeply decreases in the section SB (SB1), as compared with the first embodiment. Consequently, it is possible to much more strengthen a suppression effect of the reverberation component than the first embodiment.

Although, in the above description, the total sum of the spatial auto correlation (power) of the sound signal $x_L(t)$ and the sound signal $x_R(t)$ is the spatial auto correlation Ca(k, m), it is also possible for the auto correlation calculation unit 57 to calculate the spatial auto correlation of the sound signal $x_L(t)$ or the sound signal $x_R(t)$ as the spatial auto correlation Ca(k, m). That is, the auto correlation calculation unit 57 is included as an element to calculate the spatial auto correlation Ca(k, m) of the sound signal $x_L(t)$ and/or the sound signal $x_R(t)$.

Fourth Embodiment

Figure 10:
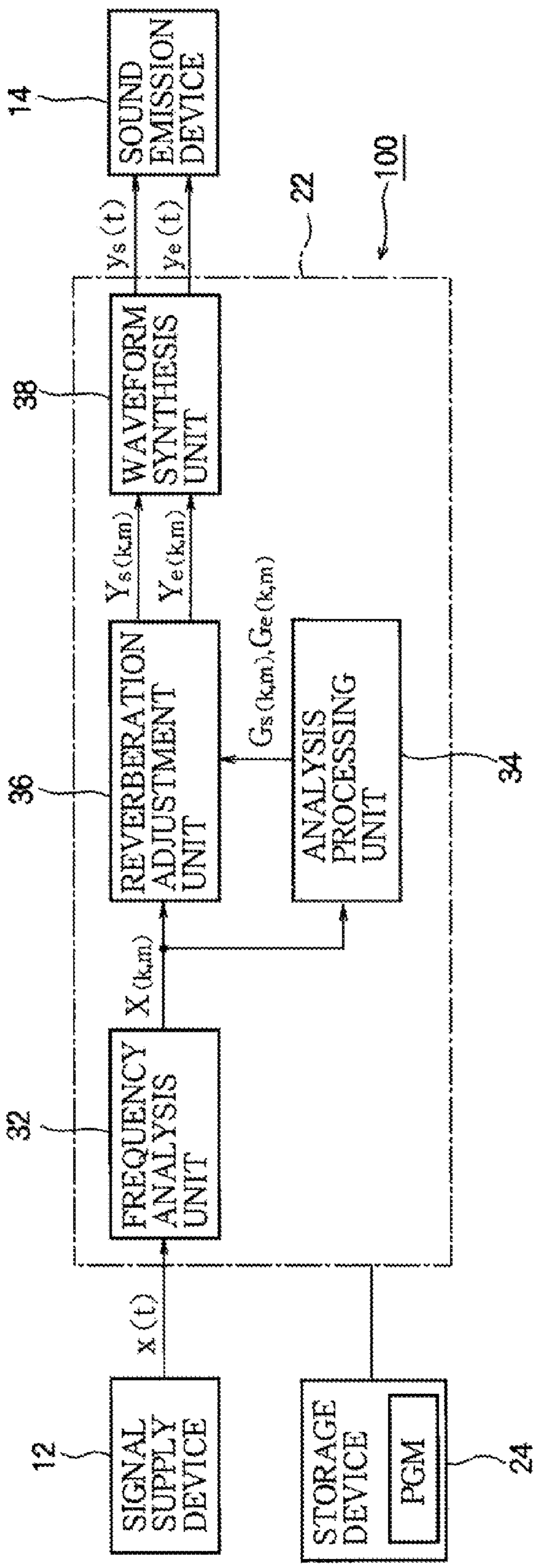
FIG. 10 is a block diagram of a sound processing device according to a fourth embodiment of the present invention.

FIG. 10 is a block diagram of a sound processing device 100 according to a fourth embodiment of the present invention. As shown in FIG. 10, the sound processing device 100 according to the fourth embodiment generates an output sound signal ys(t) in which a reverberation component of an input sound signal x(t) has been suppressed and another output sound signal ye(t) in which the reverberation component of the input sound signal x(t) has been enhanced.

An analysis processing unit 34 (an adjustment value calculation unit 44) of the fourth embodiment sequentially calculates an adjustment value Gs(k, m) and an adjustment value Ge(k, m) corresponding to a first index value $Q_1(k, m)$ and a second index value $Q_2(k, m)$ with respect to each frequency in every unit interval. A method of calculating the adjustment value Gs(k, m) for reverberation suppression is the same as the first embodiment. The adjustment value Ge(k, m) is a variable to enhance (extract) the reverberation component of the sound signal x(t).

Roughly speaking, the adjustment value calculation unit 44 calculates the adjustment value Ge(k, m) so that the more predominant the reverberation component (rear reverberation sound) is in a k-th frequency component of the sound signal x(t) of an m-th unit interval, the greater the adjustment value Ge(k, m) is. Specifically, the adjustment value calculation unit 44 (threshold value processing unit 64) subtracts the adjustment value Gs(k, m) for reverberation suppression calculated by equation (3) from a predetermined value (1 in the following illustration) to calculate the adjustment value Ge(k, m) for reverberation enhancement (Ge(k, m)=1−Gs(k, m)). Consequently, the adjustment value Ge(k, m) is maintained at zero in a section SA in which a direct sound and an initial reflected sound are present, and increases over time to a predetermined value 1−Gmin in a section SB in which a rear reverberation sound is present. That is, the first adjustment value Ge(k, m) in a case in which the first index value $Q_1(k, m)$ exceeds the second index value $Q_2(k, m)$ (in the section SA) is less than a second adjustment value Ge(k, m) in a case in which the first index value $Q_1(k, m)$ is below the second index value $Q_2(k, m)$ (in the section SB). Meanwhile, an index value calculation unit 42A is identical in construction and operation to that of the first embodiment.

A reverberation adjustment unit 36 applies the adjustment value Gs(k, m) and the adjustment value Ge(k, m) to the sound signal x(t) (spectrum X(k, m)). Specifically, the reverberation adjustment unit 36 multiplies the spectrum X(k, m) of the sound signal x(t) by the adjustment value Gs(k, m) to calculate a spectrum Ys(k, m) in the same manner as the first embodiment. Also, the reverberation adjustment unit 36 multiplies the spectrum X(k, m) of the sound signal x(t) by the adjustment value Ge(k, m) to calculate a spectrum Ye(k, m) (Ye(k, m)=Ge(k, m)X(k, m)). A waveform synthesis unit 38 generates a sound signal ys(t) from the spectrum Ys(k, m). Also, the waveform synthesis unit 38 generates a sound signal ye(t) from the spectrum Ye(k, m). Since the adjustment value Gs(k, m) is set to a less value (zero) in the section SA in which the direct sound and the initial reflected sound are present than in the section SB in which the rear reverberation sound is present, the sound signal ye(t), in which the reverberation component of the sound signal x(t) has been enhanced (the direct sound and the initial reflected sound have been suppressed), is generated. That is, the sound signal x(t) is divided into the sound signal ys(t) in which the reverberation component has been suppressed and the sound signal ye(t) in which the reverberation component has been enhanced. The sound signal ys(t) and the sound signal ye(t) are selectively supplied to the sound emission device 14, for example, according to a user command.

The fourth embodiment also realizes the same effects as the first embodiment. Also, in the fourth embodiment, the adjustment value Ge(k, m) for reverberation enhancement is generated based on the first index value $Q_1(k, m)$ and the second index value $Q_2(k, m)$ following the time change of the sound signal x(t). Consequently, it is possible to enhance (extract) the reverberation component of the sound signal x(t) through a simple process without the necessity of performing a complicated process, such as estimation of the reverberation component.

Although, in the above description, the sound signal ys(t) and the sound signal ye(t) are selectively reproduced, a method of using the sound signal ys(t) and the sound signal ye(t) is not limited to the above illustration. For example, in a surround system in which a plurality of speakers is disposed around an audience, the sound signal ys(t) and the sound signal ye(t) are generated with respect to a left channel sound signal $x_L(t)$ and a right channel sound signal $X_R(t)$. The left channel sound signal ys(t) is reproduced through the left speaker, and the left channel sound signal ye(t) is reproduced through the left rear speaker. In the same manner, the right channel sound signal ys(t) is reproduced through the right speaker, and the right channel sound signal ye(t) is reproduced through the right rear speaker. According to the above construction, it is possible to generate a four channel surround signal capable of forming a sound field having high realism from the two left and right channel sound signals x(t) ($x_L(t)$, $X_R(t)$). Also, in a case in which different sound effects are applied to the sound signal ys(t) and the sound signal ye(t), and then the sound signal ys(t) and the sound signal ye(t) are mixed, it is possible to realize various sound effects.

Although, in the above description, the construction of generating both the sound signal ys(t) and the sound signal ye(t) is illustrated, it is also possible to generate only the sound signal ye(t) in which the reverberation component has been enhanced. That is, the analysis processing unit 34 calculates the adjustment value Ge(k, m) for reverberation component enhancement in every unit interval, and the reverberation adjustment unit 36 applies the adjustment value Ge(k, m) to the spectrum X(k, m) of the sound signal x(t), thereby generating the spectrum Ye(k, m) of the sound signal ye(t) in which the reverberation component has been enhanced. Also, the construction of the fourth embodiment to calculate the adjustment value Ge(k, m) and to apply the adjustment value Ge(k, m) to the sound signal x(t) may be applied to the second embodiment and the third embodiment in the same manner.

Fifth Embodiment

Figure 11:
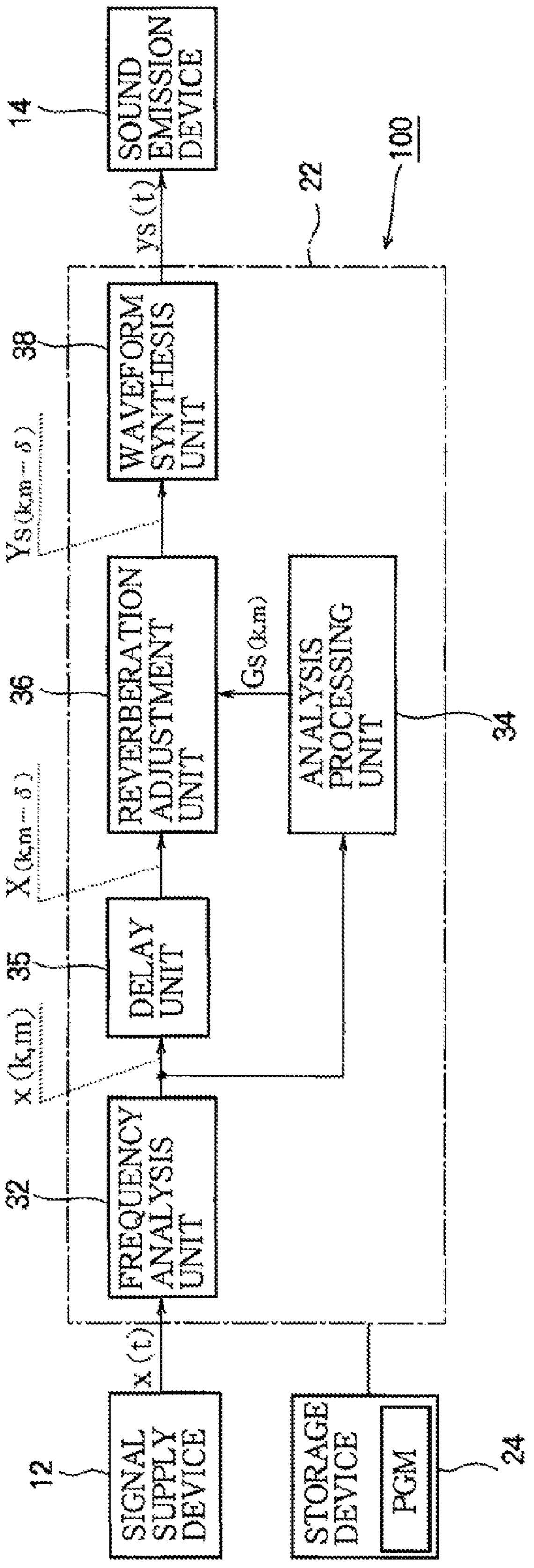
FIG. 11 is a block diagram of a sound processing device according to a fifth embodiment of the present invention.

FIG. 11 is a block diagram of a sound processing device 100 according to a fifth embodiment of the present invention. The sound processing device 100 of the fifth embodiment is configured by adding a delay unit 35 to the sound processing device 100 of the first embodiment. The delay unit 35 is a memory circuit to delay a spectrum X(k, m) generated by a frequency analysis unit 32 as much as time equivalent to δ unit intervals. Meanwhile, an analysis processing unit 34 is identical in construction to that of the first embodiment.

At a time point when an adjustment value Gs(k, m) of an m-th unit interval is directed from the analysis processing unit 34 to a reverberation adjustment unit 36, a spectrum X(k, m−δ) of a unit interval ((m−δ)-th unit interval) before the m-th unit interval by δ unit intervals is directed from the delay unit 35 to the reverberation adjustment unit 36. The reverberation adjustment unit 36 multiplies the adjustment value Gs(k, m) by the spectrum X(k, m−δ) of the sound signal x(t) to generate a spectrum Ys(k, m−δ). The fifth embodiment also realizes the same effects as the first embodiment. Meanwhile, the construction of the fifth embodiment to delay the sound signal x(t) may be applied to the second embodiment, the third embodiment, and the fourth embodiment in the same manner.

Meanwhile, in a case in which a time constant τ1 of a first smoothing unit 51 and a time constant τ2 of a second smoothing unit 52 are long, a first index value $Q_1(k, m)$ and a second index value $Q_2(k, m)$ are changed gently, and therefore, the time change of the adjustment value Ga(k, m) may be delayed with respect to the sound signal x(t). In the construction in which the adjustment value Gs(k, m) of each unit interval is applied to the sound signal x(t) (spectrum X(k, m)) of the unit interval, therefore, a reverberation component may not be sufficiently adjusted (suppressed or enhanced). In the fifth embodiment, the adjustment value Gs(k, m) of each unit interval is applied to the sound signal x(t) (spectrum X(k, m−δ)) of the past unit interval, and therefore, even in a case in which the time constant τ1 and the time constant τ2 are long, it is possible to sufficiently adjust the reverberation component. Meanwhile, the same construction may also be adopted to generate the sound signal ye(t) in the fourth embodiment.

Sixth Embodiment

Figure 12:
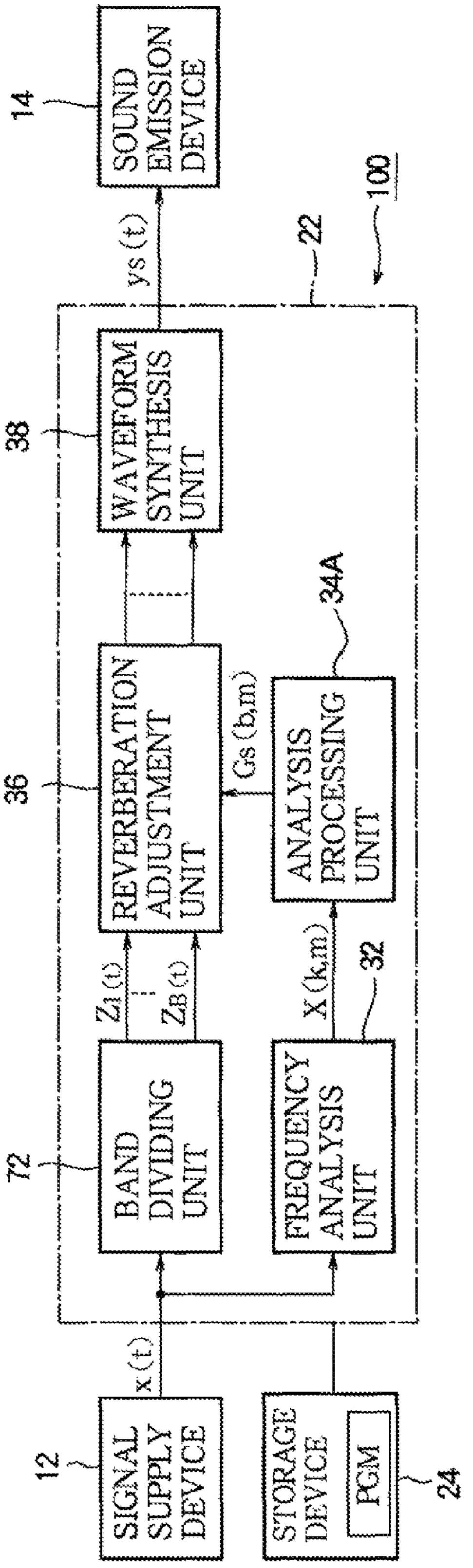
FIG. 12 is a block diagram of a sound processing device according to a sixth embodiment of the present invention.

FIG. 12 is a block diagram of a sound processing device 100 according to a sixth embodiment of the present invention. The sound processing device 100 according to the sixth embodiment of the present invention is configured so that a band dividing unit 72 is added to elements (a frequency analysis unit 32, an analysis processing unit 34A, a reverberation adjustment unit 36, and a waveform synthesis unit 38) similar to those of the first embodiment. The band dividing unit 72 divides a sound signal x(t) supplied from a signal supply device 12 into time domains of B band components Z1(*t*) to ZB(t) corresponding to different frequency bands (hereinafter, referred to as 'divided bands'). A b-th (b=1 to B) band component Zb(t) is a sound component of a time domain in a b-th divided band of B divided bands delimited on a frequency axis. Specifically, a filter constituted by B band pass filters (for example, FIR type or IIR type filters) having different pass bands is preferably used as the band dividing unit 72. Each of the divided bands contains a plurality of frequencies (bins), an adjustment value Gs(k, m) of each of which is calculated. For example, the bandwidth of each of the divided bands is set to about several hundred Hz. Meanwhile, if the number of the divided bands is too small, a suppression effect of a reverberation component is lowered. On the other hand, if the number of the divided bands is too large, the amount of operations is increased. For example, in a case in which a sampling frequency of the sound signal x(t) is 44.1 kHz, the total number of the divided bands is preferably set to about several tens. Neighboring divided bands on the frequency axis may partially overlap. Also, the bandwidth may differ at every divided band.

In the same manner as in the first embodiment, the frequency analysis unit 32 of FIG. 12 sequentially generates a spectrum X(k, m) of the sound signal x(t) in every unit interval. Meanwhile, the duration of each unit interval is preferably about several tens of milliseconds. The analysis processing unit 34A sequentially generates an adjustment value Gs(b, m) (Gs(1, m) to Gs(B, m)) according to the spectrum X(k, m) generated by the frequency analysis unit 32 with respect to each of the divided bands in each unit interval.

Figure 13:
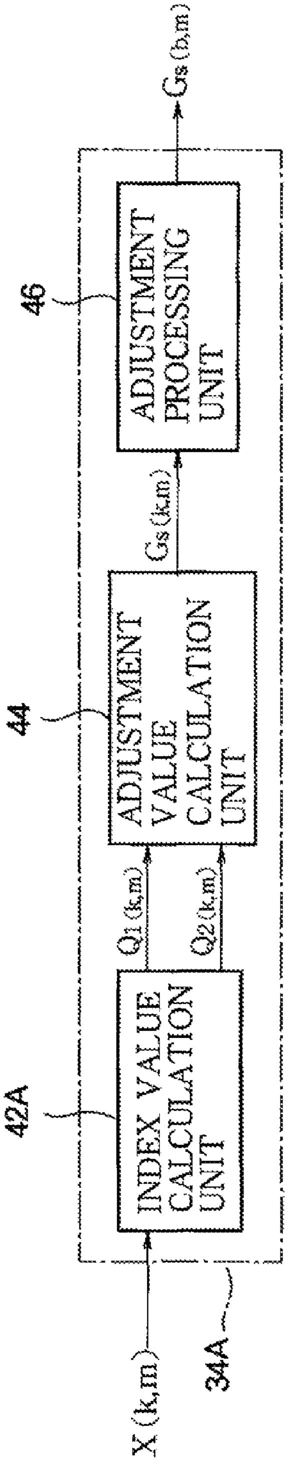
FIG. 13 is a block diagram of an analysis processing unit in the sixth embodiment.

As illustrated in FIG. 13, the analysis processing unit 34A of the sixth embodiment is configured so that an adjustment processing unit 46 is added to the elements (the index value calculation unit 42A and the adjustment value calculation unit 44) of the analysis processing unit 34 illustrated in the first embodiment. In the same manner as in the first embodiment, the index value calculation unit 42A and the adjustment value calculation unit 44 sequentially generate an adjustment value Gs(k, m) of each frequency based on a first index value $Q_1$(k, m) and a second index value $Q_2$(k, m) corresponding to the spectrum X(k, m) generated by the frequency analysis unit 32 in each unit interval. Specifically, the index value calculation unit 42A smoothes power $|X(k, m)|^2$ of each frequency of the spectrum X(k, m) of the sound signal x(t) using different time constants to calculate the first index value $Q_1$(k, m) and the second index value Q2(k, m), and the adjustment value calculation unit 44 sequentially calculates an adjustment value Gs(k, m) based on the first index value $Q_1$(k, m) and the second index value $Q_2$(k, m) calculated by the index value calculation unit 42A with respect to each frequency in every unit interval.

The adjustment processing unit 46 of FIG. 13 generates an adjustment value Gs(b, m) of every divided band from the adjustment value Gs(k, m) calculated by the adjustment value calculation unit 44 at every frequency. Specifically, a representative value (typically, an average value) of an adjustment value Gs(k, m) corresponding to each frequency in a b-th divided band is calculated as an adjustment value Gs(b, m). Meanwhile, it is also possible to calculate the weighted sum of the adjustment value Gs(k, m) of each frequency in the b-th divided band as an adjustment value Gs(b, m). For example, the weighted sum of each adjustment value Gs(k, m) using a relative ratio ($|X(k, m)|/\Sigma|X(k, m)|$) of an amplitude $|X(k, m)|$ of one frequency in the b-th divided band to the total sum $\Sigma|X(k, m)|$ of an amplitude $|X(k, m)|$ of each frequency in the divided band as a weighted value is preferable as an adjustment value Gs(b, m) of the b-th divided band.

The reverberation adjustment unit 36 sequentially applies the adjustment value Gs(b, m) generated by the analysis processing unit 34A (the adjustment processing unit 46) to the respective band components Z1(*t*) to ZB(t) generated by the band dividing unit 72 in every unit interval. Specifically, the reverberation adjustment unit 36 performs amplitude adjustment processing to multiply the band component Zb(t) by the adjustment value Gs(b, m) at every divided band. A reverberation component of the band component Zb(t) is suppressed by multiplication of the adjustment value Gs(b, m). The waveform synthesis unit 38 synthesizes (for example, adds) B band components Gs(b, m)Zb(t) (Gs(1, m)Z1(*t*) to Gs(b, m)ZB(t)) after adjustment performed by the reverberation adjustment unit 36 (after suppression of the reverberation component) to generate a sound signal ys(t).

As can be understood from the above description, according to the sixth embodiment, the spectrum X(k, m) of the sound signal x(t) is used to calculate the adjustment value Gs(b, m) but is not directly applied to generation of the sound signal ys(t) (duplicate addition in the time domain). According to the sixth embodiment, therefore, it is not necessary for unit intervals, the spectrum X(k, m) of each of which is calculated, to overlap with each other on a time axis.

Figure 14:
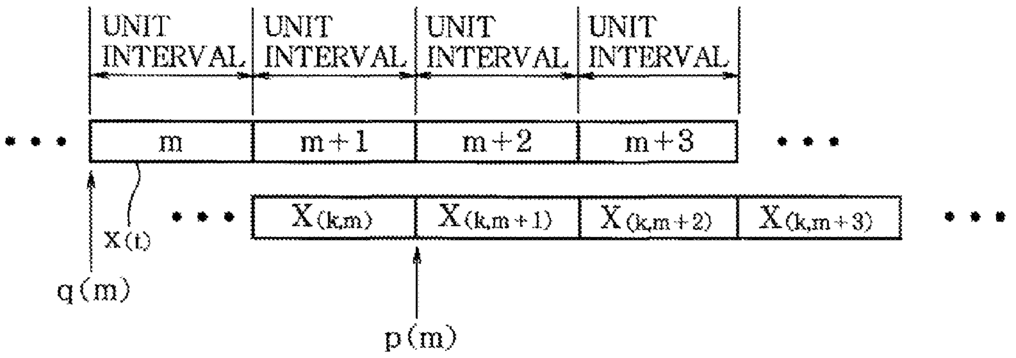
FIG. 14 is an explanatory diagram showing a temporal relation between a sound signal and a spectrum.

FIG. 14 is a view illustrating a time-based relationship between an arbitrary band component Zb(t) and the adjustment value Gs(b, m). Since all samplings in an m-th unit interval of the sound signal x(t) are necessary to calculate an arbitrary spectrum X(k, m), the calculation of the spectrum X(k, m) performed by the frequency analysis unit 32 is delayed with respect to the sound signal x(t) by one unit interval. Consequently, the adjustment value Gs(b, m) corresponding to the m-th unit interval may be used to adjust the band component Zb(t) at a time point p(m) delayed with respect to a start point q(m) of the m-th unit interval by two unit intervals. On the other hand, the band dividing unit 12 generates each band component Zb(t) in the time domain, and therefore, delay does not occur in each band component Zb(t). In the reverberation adjustment unit 36 of the sixth embodiment, therefore, the adjustment value Gs(b, m) corresponding to the m-th unit interval is applied to an (m+2)-th unit interval of the band component Zb(t). Meanwhile, in a stage in which calculation of the adjustment value Gs(b, m) is not commenced (for example, in first and second unit intervals of the sound signal x(t)), a predetermined value (for example, 1) is applied as the adjustment value Gs(b, m).

Figure 15:
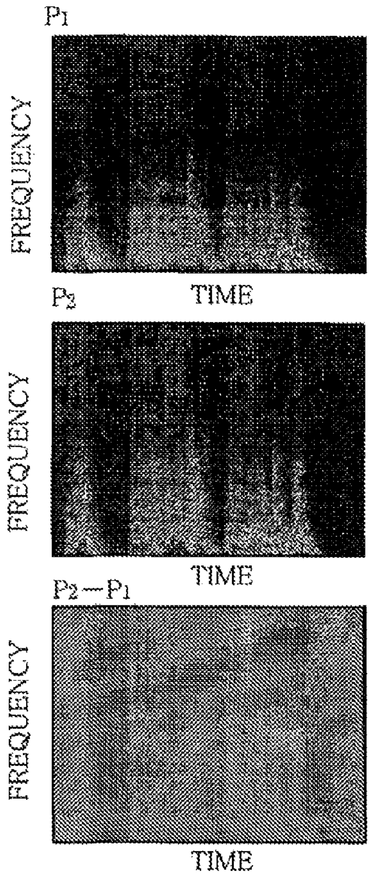
FIG. 15 is an explanatory diagram showing suppression effect of reverberation component in the sixth embodiment.

In FIG. 15, a spectrogram P1 of the sound signal x(t), a spectrogram P2 of the sound signal ys(t) after reverberation suppression performed by the sound processing device according to the sixth embodiment, and the difference therebetween (P2−P1) are shown. The difference (P2−P1) means that the lower display gradation is, the less the value is (that is, a reverberation component suppressed through processing performed by the sound processing device). As can be seen from the comparison between the spectrogram P1 and the spectrogram P2 or the difference (P2−P1), according to the sixth embodiment, it is possible to effectively suppress the reverberation component of the sound signal x(t) irrespective of the construction in which the adjustment value Gs(b, m) is delayed with respect to the band component Zb(t).

The sixth embodiment also realizes the same effects as the first embodiment. Also, in the sixth embodiment, the sound signal x(t) is divided into the B band components Z1(*t*) to ZB(t) by the band dividing unit 72 (filter bank) and processed using the adjustment value Gs(b, m). As compared with the first embodiment in which the adjustment value Gs(k, m) is applied to the spectrum X(k, m) generated by the frequency analysis unit 32, the sixth embodiment has an effect in that it is possible to suppress delay of the sound signal ys(t) with respect to the sound signal x(t). For example, when assuming a scene in which a sound signal x(t) and a video signal which have been recorded at the same time are reproduced (for example, a scene in which a sound signal x(t) and a video signal are transmitted and received between communication terminals in a remote conference system), if a sound signal ys(t) after reverberation suppression is delayed with respect to the sound signal x(t), the sound signal ys(t) and the video signal may not be exactly synchronized with each other. According to the sixth embodiment, the delay of the sound signal ys(t) with respect to the sound signal x(t) is suppressed, and therefore, it is possible to exactly synchronize the sound signal ys(t) and the video signal with each other.

Meanwhile, in the construction in which different adjustment values Gs(b, m) are applied to every unit interval of the band component Zb(t) as previously illustrated, the sound volume of the band component Gs(b, m)Zb(t) after adjustment performed by the reverberation adjustment unit 36 may be discontinuously changed at each interface between the respective unit intervals with the result that the reproduced sound of the sound signal ys(t) may be unnatural. For this reason, a construction of cross-fading the adjustment values Gs(b, m) in the respective unit intervals arranged in tandem is preferred. For example, the adjustment processing unit 46 increases an adjustment value Gs(b, m) of an arbitrary unit interval over time and, in addition, decreases an adjustment value Gs(b, m−1) of the preceding unit interval over time, adds the increased adjustment value Gs(b, m) to the decreased adjustment value Gs(b, m−1), and applies the resultant value to the band component Zb(t). According to the above-described construction, discontinuous change in sound volume of the band component Gs(b, m)Zb(t) is suppressed, and therefore, it is possible to generate a sound signal ys(t), the reproduced sound of which is natural. Although, in the above description, the construction based on the first embodiment is illustrated, the construction of the second embodiment to the fifth embodiment may be applied to the sixth embodiment.

Seventh Embodiment

In a case in which the reverberation time of the sound signal x(t) is long, the first index value $Q_1(k, m)$ is changed with respect to the second index value $Q_2(k, m)$ in a post reverberation period, and therefore, a ratio R(k, m) (adjustment value Gs(k, m)) is unstable. As a result, the sound volume of the sound signal ys(t) may fluctuate, and therefore, the sound quality of the reproduced sound may be deteriorated. According to the seventh embodiment, the fluctuation in sound volume of the sound signal ys(t) in the post reverberation period is suppressed in consideration of the above tendency.

Figure 16:
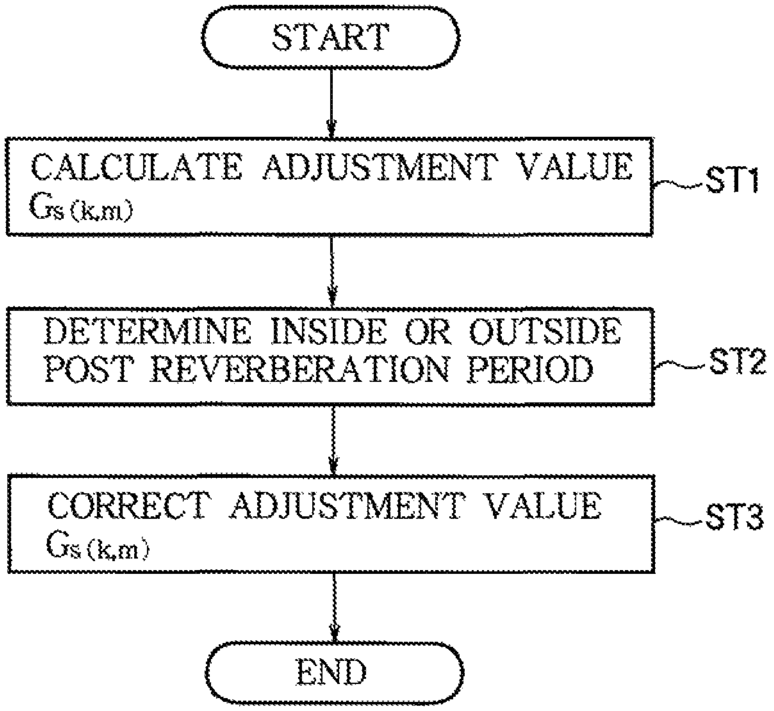
FIG. 16 is a flowchart showing operation of an adjustment value calculation unit in a seventh embodiment.

An adjustment value calculation unit 44 of the seventh embodiment calculates an adjustment value Gs(k, m) of each unit interval while distinguishing between unit intervals in a post reverberation period and unit intervals outside the post reverberation period to suppress the fluctuation in sound volume of a sound signal ys(t) in the post reverberation period. Specifically, the adjustment value calculation unit 44 calculates the adjustment value Gs(k, m) in every unit interval of the sound signal x(t) so that the adjustment value Gs(k, m) of a case in which the unit interval belongs to the post reverberation period is less than the adjustment value Gs(k, m) of a case in which the unit interval does not belong to the post reverberation period (that is, a first suppression effect of a reverberation component achieved by the former adjustment value Gs(k, m) exceeds a second suppression effect of a reverberation component achieved by the latter adjustment value Gs(k, m)). FIG. 16 is a flow chart showing a process performed by the adjustment value calculation unit 44 of the seventh embodiment.

As shown in FIG. 16, the adjustment value calculation unit 44 calculates an adjustment value Gs(k, m) in every unit interval through operations of equation (2) and equation (3) (ST1) to decide whether each unit interval belongs to a post reverberation period of a sound signal x(t) (ST2). Specifically, in consideration of a tendency that a first index value $Q_1(k, m)$ is lowered to a small value in the post reverberation period, the adjustment value calculation unit 44 compares the first threshold value $Q_1(k, m)$ with a predetermined threshold value QTH to decide whether the unit interval corresponds to the post reverberation period. That is, in a case in which the first threshold value $Q_1(k, m)$ exceeds the threshold value QTH ($Q_1(k, m) \geq QTH$), it is decided that the unit interval does not correspond to the post reverberation period (corresponds to an initial reflection period). On the other hand. In a case in which the first threshold value $Q_1(k, m)$ is less than the threshold value QTH ($Q_1(k, m) < QTH$), it is decided that the unit interval belongs to the post reverberation period.

The adjustment value calculation unit 44 corrects the adjustment value Gs(k, m) calculated at step ST1 based on the decision result of step ST2 (ST3). Specifically, the adjustment value calculation unit 44 fixes the adjustment value Gs(k, m) of the unit interval ($Q_1(k, m) \geq QTH$) not belonging to: the post reverberation period as a value calculated by equation (3) (equation (7A)), and the adjustment value Gs(k, m) is lowered from the value calculated by equation (3) with respect to the unit interval ($Q_1(k, m) < QTH$) decided belonging to the post reverberation period (equation (7B)). Specifically, the adjustment value calculation unit 44 multiplies the adjustment value Gs (k, m) calculated by equation (3) in each unit interval in the post reverberation period by a coefficient $\gamma$. The coefficient $\gamma$ is a positive number less than 1 ($0<\gamma<1$). Consequently, the sound volume is lowered in the section of the sound signal ys(t) corresponding to the post reverberation period of the sound signal x(t), and therefore, an audience may not perceive the deterioration in sound quality of the reproduced sound.

$$Gs(k,m)=\begin{cases} Gs(k,m) \ \ldots \ (7A) & \text{[OUTSIDE POST REVERBERATION PERIOD]} \\ \gamma\cdot Gs(k,m) \ \ldots \ (7B) & \text{[INSIDE POST REVERBERATION PERIOD]} \end{cases}$$

The seventh embodiment also realizes the same effects as the first embodiment. Also, according to the seventh embodiment, the sound volume of the sound signal ys(t) in the post reverberation period is lowered, and therefore, it is possible to suppress the deterioration in sound quality of the reproduced sound of the sound signal ys(t) even in a case in which the ratio R(k, m) (adjustment value Gs(k, m)) is unstably fluctuated in the post reverberation period. Meanwhile, the construction of the second embodiment to the sixth embodiment may be applied to the seventh embodiment.

Modification of Seventh Embodiment (1) A construction or method of deciding whether each unit interval belongs to the post reverberation period is optional. For example, it is also possible to use a third index value $Q_3(k, m)$ following the power $|X(k, m)|^2$ of the sound signal x(t) at a following degree between the first index value $Q_1(k, m)$ and the second index value $Q_2(k, m)$ in deciding whether the unit interval belongs to the post reverberation period.

In the construction of calculating the first index value $Q_1(k, m)$ and the second index value $Q_2(k, m)$ using equation (1A) and equation (1B) as mentioned above, the index value calculation unit 42A calculates the third index value $Q_3(k, m)$, for example, through operation of the following equation (1C). The number $N_3$ of the unit intervals used to calculation of the third index value $Q_3(k, m)$ is set to a value between the number $N_1$ of the unit intervals used to calculation (equation (1A)) of the first index value $Q_1(k, m)$ and the number $N_2$ of the unit intervals used to calculation (equation (1B)) of the second index value $Q_2(k, m)$ ($N_1<N_3<N_2$). Consequently, the third index value $Q_3(k, m)$ follows the power $|X(k, m)|^2$ of the sound signal x(t) at a time constant τ3 (τ1<τ3<τ2) between a time constant τ1 of the first index value $Q_1(k, m)$ and a time constant τ2 of the second index value $Q_2(k, m)$. Meanwhile, it is also possible to calculate the third index value $Q_3(k, m)$ using the same weighted moving average of equation (5A) and equation (5B).

$$Q_3(k,m)=\frac{1}{N_3}\sum_{i=0}^{N_3-1}|X(k,m-i)|^2 \qquad (1C)$$

Also, in the construction of calculating the first index value $Q_1(k, m)$ and the second index value $Q_2(k, m)$ using equations (1A) and (1B) as mentioned above, the third index value $Q_3(k, m)$ is calculated, for example, by the following equation (4C). A smoothing coefficient $\alpha_3$ used in calculating the third index value $Q_3(k, m)$ is set to a value between a smoothing coefficient $\alpha_1$ used in calculating (equation (4A)) the first index value $Q_1(k, m)$ and a smoothing coefficient $\alpha_2$ used in calculating (equation (4B)) the second index value $Q_2(k, m)$ ($\alpha_2<\alpha_3<\alpha 1$). Consequently, the third index value $Q_3(k, m)$ follows the power $|X(k, m)|^2$ of the sound signal x(t) at the time constant τ3 (τ1<τ3<τ2) between the time constant τ1 of the first index value $Q_1(k, m)$ and the time constant τ2 of the second index value $Q_2(k, m)$.

$$Q_3(k,m)=\alpha_3\cdot|X(k,m)|^2+(1-\alpha_3)\cdot Q_3(k,m-1) \qquad (4C)$$

As described above, the third. Index value $Q_3(k, m)$ follows the power $|X(k, m)|^2$ of the sound signal x(t) at a following degree between the first index value $Q_1(k, m)$ and the second index value $Q_2(k, m)$. In each unit interval in the post reverberation period, therefore, it is expected that the third index value $Q_3(k, m)$ exceeds the first index value $Q_1(k, m)$ ($Q_3(k, m)>Q_1(k, m)$). In consideration of the above tendency, the adjustment value calculation unit 44 compares the third index value $Q_3(k, m)$ with the first index value $Q_1(k, m)$ to decide whether the unit interval corresponds to the post reverberation period (step ST2 of FIG. 16). Specifically, in a case in which the third index value $Q_3(k, m)$ is less than the first index value $Q_1(k, m)$ ($Q_3(k, m)\leq Q_1(k, m)$), it is decided that the unit interval does not belong to the post reverberation period. On the other hand, in a case in which the third index value $Q_3(k, m)$ exceeds the first index value $Q_1(k, m)$ ($Q_3(k, m)>Q_1(k, m)$), it is decided that the unit interval corresponds to the post reverberation period. In the same manner as the above embodiment, the adjustment value Gs(k, m) of the unit interval ($Q_3(k, m)\leq Q_1(k, m)$) outside the post reverberation period is fixed as a value calculated by equation (3) (equation (7A)), and the adjustment value Gs(k, m) is corrected based on the coefficient γ with respect to the unit interval ($Q_3(k, m)>Q_1(k, m)$) in the post reverberation period (equation (7B)).

(2) A construction or method of lowering the adjustment value Gs(k, m) of each unit interval in the post reverberation period is not limited to the above illustration. For example, in the construction of calculating the third index value $Q_3(k, m)$ using equation (1C) and equation (4C) as mentioned above, it is also possible to calculate the adjustment value Gs(k, m) of each unit interval using equation (8A) and equation (8B) as illustrated below. Meanwhile, in a case in which the adjustment value Gs(k, m) is calculated using equation (8A) and equation (8B), calculation of the ratio R(k, m) performed by equation (2) is omitted.

$$Gs(k,m)=\begin{cases} \min\left\{\frac{Q_1(k,m)}{Q_2(k,m)}, 1.0\right\} \ \ldots \ (8A) & \text{[OUTSIDE POST REVERBERATION PERIOD]} \\ \min\left\{\frac{Q_1(k,m)}{Q_2(k,m)\cdot Q_3(k,m)}, 1.0\right\} \ \ldots \ (8B) & \text{[INSIDE POST REVERBERATION PERIOD]} \end{cases}$$

Symbol min[A, B] of equation (8A) and equation (8B) indicates an operator to select the minimum value of a value A and a value B. As can be understood from equation (8A) and equation (8B), an adjustment value Gs(k, m) is calculated with respect to each unit interval outside the post reverberation period in the same manner as in the first embodiment, and an adjustment value Gs(k, m) less than the ratio R(k, m) is calculated with respect to each unit interval in the post reverberation period. Meanwhile, it is also possible to replace equation (8B) by the following equation (8C) (in which multiplication of a denominator of equation (8B) is changed into summation thereof).

$$\min\left\{\frac{Q_1(k,m)}{Q_2(k,m)+Q_3(k,m)},\,1.0\right\} \tag{8C}$$

(3) Although, in the above illustration, the adjustment value Gs(k, m) of each unit interval in the post reverberation period is lowered according to comparison with the adjustment value Gs(k, m) of each unit interval outside the post reverberation period, the construction of suppressing the fluctuation in sound volume of the sound signal ys(t) in the post reverberation period is not restricted to the above illustration. For example, it is possible to adopt a construction of deciding whether each unit interval belongs to the post reverberation period using the method as illustrated above and lowering the sound volume of the unit interval in the post reverberation period of the sound signal ys(t) generated by the waveform synthesis unit 38 in a time domain or a construction of lowering the sound volume of the spectrum Ys(k, m) in the post reverberation period of the spectrum Ys(k, m) after adjustment performed by the reverberation adjustment unit 36 in a frequency domain. Calculation of adjustment value Gs(k, m) is the same as in the first embodiment.

Modifications

The respective embodiments as described above may be variously modified. Concrete modifications will hereinafter be illustrated. Two or more modifications arbitrarily selected from the following illustrations may be properly combined.

(1) Although, in the respective embodiments as described above, the time constant τ1 of smoothing performed by the first smoothing unit 51 and the time constant τ2 of smoothing performed by the second smoothing unit 52 are common over a plurality of frequencies, it is also possible to individually set the time constant τ1 and the time constant τ2 at every frequency (every band).

As can be understood from equation (2) and equation (3), in the section SB in which the second index value $Q_2$(k, m) exceeds the first index value $Q_1$(k, m), the greater the difference between the first index value $Q_1$(k, m) and the second index value $Q_2$(k, m) (the difference between the time constant τ1 and the time constant τ2) is, the less the adjustment value Gs(k, m) is, and therefore, the suppression effect of the reverberation component is increased. On the other hand, the reverberation component may be tangible in a low frequency range rather than in a high frequency range. For this reason, a construction of increasing the difference between the time constant τ1 and the time constant τ2 as much as the frequency of the low band side (a construction of rapidly decreasing the adjustment value Gs(k, m) as much as the frequency of the low band side) is preferred. For example, in a case in which attention is focused on a k1-th frequency f(k1) on a frequency axis and a frequency f(k2) exceeding the frequency f(k1), the difference between a time constant τ1(k1) and a time constant τ2(k1) corresponding to the f(k1) exceeds the difference between a time constant τ1(k2) and a time constant τ2(k2) corresponding to the f(k2).

(2) It is also possible to change the time constant τ1, the time constant τ1, or both the time constant τ1 and the time constant τ2 over time. For example, since there is a tendency that the greater the difference between the time constant τ1 and the time constant τ2 is (the time constant τ2 is great with respect to the time constant τ1), the more rapidly the adjustment value Gs(k, m) decreases, as previously described, a construction of increasing the time constant τ2 with respect to the time constant τ1 over time is preferred. In the above construction, the decrease of the adjustment value Gs(k, m) is accelerated. For example, even in a case in which the time length of the reverberation component is sufficiently long, therefore, it is possible to effectively suppress the reverberation component. Meanwhile, the time constant τ1 and the time constant τ2 are initialized, for example, at a time point when sound rises in the sound signal x(t) (for example, at a time point when the adjustment value Gs(k, m) is reversed from decrease to increase).

(3) A method of calculating the adjustment value Gs(k m) and the adjustment value Ge(k, m) based on the first index value $Q_1$(k, m) and the second index value $Q_2$(k, m) is optional. For example, it is possible to adopt a construction of calculating the adjustment value Gs(k, m) and the adjustment value Ge(k, m) through a predetermined operation having the first index value $Q_1$(k, m) and the second index value $Q_2$(k, m) as variables and a predetermined operation having the ratio R(k, m) as a variable. Also, although, in the respective embodiments as described above, the adjustment value Ge(k, m) is calculated based on the ratio R(k, m) of the first index value $Q_1$(k, m) to the second index value $Q_2$(k, m), it is possible to calculate the adjustment value Ge(k, m) for reverberation enhancement in the same manner as the fourth embodiment, for example, in a case in which the ratio R(k, m) of the second index value $Q_2$(k, m) to the first index value $Q_1$(k, m) is applied to the operation of equation (3).

As can be understood from the above description, the adjustment value calculation unit 44 is included as an element to calculate the adjustment values Gs(k, m) and Ge(k, m) to adjust (suppress or enhance) the reverberation component of the sound signal x(t) based on the first index value $Q_1$(k, m) and the second index value $Q_2$(k, m). For example, in the construction of suppressing the reverberation component, the adjustment value Gs(k, m) is calculated so that the sound signal x(t) is suppressed in a case in which the first index value $Q_1$(k, m) is below the second index value $Q_2$(k, m) (section SB) as compared with a case in which the first index value $Q_1$(k, m) exceeds the second index value $Q_2$(k, m) (section SA). On the other hand, in the construction of enhancing the reverberation component, the adjustment value Ge(k, m) is calculated so that the sound signal x(t) is suppressed in a case in which the first index value $Q_1$(k, m) exceeds the second index value $Q_2$(k, m) (section SA) as compared with a case in which the first index value $Q_1$(k, m) is below the second index value $Q_2$(k, m) (section SB).

(4) Although, in the respective embodiments as described above, the time series of the power $|X(k, m)|^2$ of the sound signal x(t) is smoothed to calculate the first index, value $Q_1$(k, m) and the second index value $Q_2$(k, m), the first smoothing unit 51 or the second smoothing unit 52 does not smooth only the power $|X(k, m)|^2$. For example, it is possible to adopt a construction of smoothing an amplitude |X(k, m)| of the sound signal x(t) or the fourth power $|X(k, m)|^4$ of the amplitude to calculate the first index value $Q_1$(k, m) or the second index value $Q_2$(k, m). That is, the first smoothing unit 51 or the second smoothing unit 52 of each embodiment as described above is included as an element to smooth a time series of signal intensity of the sound signal x(t), and the signal intensity includes the amplitude $|X(k, m)|$ or the fourth power $|X(k, m)|^4$ of the amplitude in addition to the power $|X(k, m)|^2$ of the sound signal x(t). Also, although, in the respective embodiments as described above, the adjustment value Gs(k, m) or the adjustment value Ge(k, m) is applied to the spectrum X(k, m) of the sound signal x(t), it is also possible to apply the adjustment value Gs(k, m) or the adjustment value Ge(k, m), for example, to the power $|X(k, m)|^2$ of the sound signal x(t).

(5) Although, in the respective embodiments as described above, the construction of adjusting (suppressing or enhancing) the reverberation component is illustrated, it is possible to apply the present invention to adjustment of an arbitrary sound component (hereinafter, referred to as an 'attenuation component') which is attenuated over time. The attenuation component may include a component (resonance component) of a sound played, for example, by a musical instrument in addition to the reverberation component illustrated in the respective embodiments as described above. Specifically, it is also possible to apply the present invention to adjustment of a resonance component generated by a sound board of a keyboard instrument, such as a piano, or a resonance component (body reverberation or box reverberation) of a string instrument, such as a violin, in the same manner as the respective embodiments as described above. As can foe understood from the above description, the 'reverberation component' described in the specification of the present application may be referred to as an 'attenuation component' meaning a component attenuated over time.

What is claimed is:

1. A sound processing device for processing a sound signal, comprising:
- a non-transitory storage medium storing a program;
- a processor, when executing the program, configured to:
  - calculate a first index value that follows change of the sound signal at a first following degree and a second index value that follows the change of the sound signal at a second following degree which is lower than the first following degree;
  - calculate an adjustment value effective to adjust a reverberation component of the sound signal based on difference between the first index value and the second index value; and
  - apply the adjustment value to the sound signal.

2. The sound processing device according to claim 1, further comprising:
- a filter configured to divide in a time domain the sound signal into a plurality of band components corresponding to a plurality of frequency bands;
- wherein the processor, when executing the program, is configured to:
  - successively calculate a spectrum of the sound signal;
  - calculate a plurality of adjustment values corresponding to the plurality of the frequency bands from the calculated adjustment value calculated;
  - calculate the first index value and the second index value corresponding to time series of magnitudes of the sound signal at each frequency of the spectrum of the sound signal;
  - calculate the adjustment value for each frequency of the spectrum based on the first index value and the second index value corresponding to each frequency of the spectrum; and
  - apply the plurality of the adjustment values to the plurality of the corresponding band components of the sound signal.

3. The sound processing device according to claim 1, wherein the processor, when executing the program, is configured to:
- calculate a first adjustment value in case that the first index value exceeds the second index value;
- calculate a second adjustment value in case that the first index value is lower than the second index value; and
- apply the second adjustment value to the sound signal so that the sound signal is suppressed more than a case in which the first adjustment value is applied to the sound signal.

4. The sound processing device according to claim 1, wherein the processor, when executing the program, is configured to:
- calculate a ratio of the first index value to the second index value;
- set the adjustment value to a predetermined value in case that the ratio exceeds the predetermined value; and
- set the adjustment value to the ratio in case that the ratio is below the predetermined value.

5. The sound processing device according to claim 1, wherein the processor, when executing the program, is configured to:
- apply the adjustment value to the sound signal so that the sound signal contains therein a post reverberation period; and
- sequentially calculate a time series of adjustment values in correspondence to a time series of unit intervals of the sound signal, so that the calculated adjustment value is effective to adjust the reverberation component with a first suppression effect in case that the corresponding unit interval belongs to a period other than the post reverberation period, and the calculated adjustment value is effective to adjust the reverberation component with a second suppression effect exceeding the first suppression effect in case that the corresponding unit interval belongs to the post reverberation period.

6. The sound processing device according to claim 5, wherein the processor, when executing the program, is configured to:
- determine whether each unit interval belongs to the post reverberation period or not by comparing the first index value corresponding to each unit interval with a predetermined threshold value.

7. The sound processing device according to claim 5, wherein the processor, when executing the program, is configured to:
- calculate a third index value that follows the change of the sound signal at a third following degree that is set between the first index value and the second index value; and
- determine whether each unit interval belongs to the post reverberation period or not according to the third index value.

8. The sound processing device according to claim 1, wherein the processor, when executing the program, is configured to:
- calculate a first adjustment value in case that the first index value exceeds the second index value;
- calculate a second adjustment value in case that the first index value is lower than the second index value, and apply the first adjustment value to the sound signal so as to suppress the sound signal more than a case in which the second adjustment value is applied to the sound signal.

9. The sound processing device according to claim 1, wherein the processor, when executing the program, is configured to:
- smooth a time series of an intensity of the sound signal by a first time constant so as to calculate the first index value; and
- smooth the time series of the intensity of the sound signal by a second time constant exceeding the first time constant so as to calculate the second index value.

10. The sound processing device according to claim 9, wherein the processor, when executing the program, is configured to:
- calculate a moving average of the intensity of the sound signal within a first period moving along the time series of the intensity of the sound signal for obtaining the first index value; and
- calculate a moving average of the intensity of the sound signal within a second period which is set longer than the first period and which moves along the time series of the intensity of the sound signal for obtaining the second index value.

11. The sound processing device according to claim 9, wherein the processor, when executing the program, is configured to:
- calculate an exponential average of the intensity of the sound signal with a first smoothing coefficient for obtaining the first index value, and
- calculate an exponential average of the intensity of the sound signal with a second smoothing coefficient which is set below the first smoothing coefficient for obtaining the second index value.

12. The sound processing device according to claim 1, further comprising:
- a delay circuit,
- wherein the processor, when executing the program, is configured to:
  - generate the first index value by smoothing a time series of an intensity of the sound signal in a first manner,
- wherein the delay circuit and the processor, when executing the program, are configured to:
  - generate the second index value by smoothing the time series of the intensity of the sound signal in a second manner different than the first manner so that a time change of the second index value delays from a time change of the first index value.

13. The sound processing device according to claim 1, wherein
- the sound processing device is configured to process the sound signal that is a stereo signal composed of a first signal and a second signal, and wherein
- the processor, when executing the program, is configured to:
  - sequentially calculate a spatial cross correlation between the first signal and the second signal;
  - sequentially calculate a spatial auto correlation of either the first signal or the second signal;
  - smooth a time series of the spatial cross correlation so as to calculate the first index value; and
  - smooth a time series of the spatial auto correlation so as to calculate the second index value.

14. The sound processing device according to claim 1, wherein the processor, when executing the program, is configured to:
- calculate a plurality of first index values and a plurality of second index values corresponding to a plurality of frequencies of components contained in the sound signal;
- calculate a plurality of adjustment values from the plurality of the first index values and the plurality of the second index values in correspondence to the plurality of the frequencies of the components contained in the sound signal; and
- apply each adjustment value to each component of the corresponding frequency contained in the sound signal.

15. The sound processing device according to claim 14, wherein the processor, when executing the program, is configured to:
- calculate each first index value with a first time constant for smoothing of the sound signal, the first time constant being set individually for each frequency of the sound signal; and
- calculate each second index value with a second time constant for smoothing of the sound signal, the second time constant being set individually for each frequency of the sound signal.

16. The sound processing device according to claim 14, wherein the processor, when executing the program, is configured to:
- calculate each first index value with a first time constant for smoothing of the sound signal, the first time constant being set variably along a time passage of the sound signal; and
- calculate each second index value with a second time constant for smoothing of the sound signal, the second time constant being set variably along a time passage of the sound signal.

17. The sound processing device according to claim 1, wherein the processor, when executing the program, is configured to:
- successively calculate a plurality of adjustment values in correspondence to a time series of unit intervals of the sound signal; and
- apply the adjustment value of one unit interval to the sound signal of another unit interval which is positioned prior to said one unit interval.

18. A sound processing method of processing a sound signal, comprising:
- calculating a first index value that follows change of the sound signal at a first following degree and a second index value that follows the change of the sound signal at a second following degree which is lower than the first following degree;
- calculating an adjustment value effective to adjust a reverberation component of the sound signal based on difference between the first index value and the second index value; and
- applying the adjustment value to the sound signal.

19. A machine readable non-transitory recording medium for use in a computer, the medium containing a program executable by the computer to perform processing of:
- calculating a first index value that follows change of a sound signal at a first following degree and a second index value that follows the change of the sound signal at a second following degree which is lower than the first following degree;

calculating an adjustment value effective to adjust a reverberation component of the sound signal based on difference between the first index value and the second index value; and applying the adjustment value to the sound signal.

* * * * *